US012751185B2

(12) United States Patent
Choi et al.

(10) Patent No.: US 12,751,185 B2
(45) Date of Patent: Sep. 29, 2026

(54) DISPLAY APPARATUS

(71) Applicant: LG Display Co., Ltd., Seoul (KR)

(72) Inventors: Inae Choi, Paju-si (KR); SeHong Park, Paju-si (KR); Wonrae Kim, Paju-si (KR); Sejong Seong, Paju-si (KR); SeoHyun Nam, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 394 days.

(21) Appl. No.: 18/517,823

(22) Filed: Nov. 22, 2023

(65) Prior Publication Data

US 2024/0260420 A1 Aug. 1, 2024

(30) Foreign Application Priority Data

Jan. 26, 2023 (KR) ........................ 10-2023-0010410

(51) Int. Cl.
*H10K 59/80* (2023.01)
*H10K 59/122* (2023.01)
*H10K 59/124* (2023.01)

(52) U.S. Cl.
CPC ......... *H10K 59/878* (2023.02); *H10K 59/122* (2023.02); *H10K 59/124* (2023.02); *H10K 59/879* (2023.02)

(58) Field of Classification Search
CPC .. H10K 59/878; H10K 59/122; H10K 59/124; H10K 59/879; H10K 50/856; H10K 50/858; H10K 50/865; H10K 59/121; H10K 59/875; H10K 59/32; H10K 59/351; H10K 59/8051; H10K 59/8052; H10K 59/873; H10K 59/8792
See application file for complete search history.

(56) References Cited

U.S. PATENT DOCUMENTS

2008/0231168 A1* 9/2008 Choi .................... H10K 59/122 313/500
2014/0061605 A1* 3/2014 Kim ..................... H10K 59/122 257/40
2014/0183479 A1* 7/2014 Park ................... H10K 59/1315 438/34
2016/0351638 A1* 12/2016 Im .......................... H10K 59/87
2017/0309693 A1* 10/2017 Pang ...................... H10K 59/88
2018/0006264 A1* 1/2018 Lee ...................... H10K 30/865
(Continued)

FOREIGN PATENT DOCUMENTS

KR 10-1941661 B1 1/2019
KR 10-2019-0122073 A 10/2019
(Continued)

*Primary Examiner* — Bitew A Dinke
(74) *Attorney, Agent, or Firm* — Birch, Stewart, Kolasch & Birch, LLP

(57) ABSTRACT

A display apparatus can include a plurality of subpixels disposed on a substrate; a pattern portion disposed on the substrate, the pattern portion forming a concave area between at least two subpixels among the plurality of subpixels; and a reflective pattern partially overlapping with a portion of the pattern portion. Also, the plurality of subpixels include a light emission area and a non-light emission area adjacent to the light emission area, the reflective pattern being disposed in the non-light emission area, and the non-light emission area includes a first void located between the light emission area and the reflective pattern.

33 Claims, 5 Drawing Sheets

(56) References Cited

U.S. PATENT DOCUMENTS

| | | | | |
|---|---|---|---|---|
| 2018/0158887 | A1* | 6/2018 | Yun | H10K 10/88 |
| 2018/0190934 | A1* | 7/2018 | Choi | H10K 59/122 |
| 2019/0172898 | A1* | 6/2019 | Choi | H10K 50/822 |
| 2020/0144342 | A1* | 5/2020 | Shim | H10K 50/81 |
| 2020/0257173 | A1* | 8/2020 | Tsuchiya | G02F 1/1339 |
| 2021/0066418 | A1* | 3/2021 | Seo | H10K 59/88 |
| 2021/0408441 | A1* | 12/2021 | Lee | H10K 59/1201 |
| 2022/0102471 | A1* | 3/2022 | Jang | H10K 59/122 |
| 2022/0199708 | A1* | 6/2022 | Lee | H10K 59/38 |
| 2022/0208913 | A1* | 6/2022 | Lee | H10K 59/131 |
| 2023/0255087 | A1* | 8/2023 | Jang | H10K 59/80515 257/40 |
| 2023/0320142 | A1* | 10/2023 | Mizukoshi | H10K 59/1201 257/40 |
| 2025/0204170 | A1* | 6/2025 | Yao | H10K 59/1201 |

FOREIGN PATENT DOCUMENTS

| | | | |
|---|---|---|---|
| KR | 10-2021-0026923 | A | 3/2021 |
| KR | 10-2021-0158617 | A | 12/2021 |
| KR | 10-2022-0097210 | A | 7/2022 |

* cited by examiner

DISPLAY APPARATUS

CROSS-REFERENCE TO RELATED APPLICATIONS

This application claims priority to Korean Patent Application No. 10-2023-0010410 filed in the Republic of Korea, on Jan. 26, 2023, the entirety of which is hereby incorporated by reference into the present application as if fully set forth herein.

BACKGROUND

Field of the Invention

The present disclosure relates to a display apparatus for displaying an image.

Description of the Related Art

Since an organic light emitting display apparatus has a high response speed and low power consumption, does not require a separate light source unlike a liquid crystal display apparatus, and self-emits light to be individually driven for each pixel, the organic light emitting display apparatus can implement perfect black (e.g., true black) and thus the organic light emitting display apparatus has received attention as a next-generation flat panel display apparatus.

Such a display apparatus displays an image through light emission of a light emitting element layer that includes a light emitting layer interposed between two electrodes.

Also, light extraction efficiency of the display apparatus is reduced as some of light emitted from the light emitting element layer does not reach the outside due to total reflection on the interface between the light emitting element layer and an electrode and/or between a substrate and an air layer. Also, as organic light emitting display apparatuses are implemented with higher resolution and subpixels are spaced closer together, current leakage and color mixing between adjacent subpixels becomes more of a problem. Thus, there exists a need for a display apparatus that can increase light extraction efficiency, prevent current leakage and color mixing between adjacent subpixels, and reduce overall power consumption.

SUMMARY OF THE DISCLOSURE

The present disclosure has been made in view of the above problems and it is an object of the present disclosure to provide a display apparatus in which light extraction efficiency can be improved through light extraction from a non-light emission area.

It is another object of the present disclosure to provide a display apparatus that can improve light extraction efficiency of light emitted from a light emitting element layer.

It is still another object of the present disclosure to provide a display apparatus that can improve black visibility.

It is further still another object of the present disclosure to provide a display apparatus that can reduce power consumption.

It is further still another object of the present disclosure to provide a display apparatus that can enlarge a color gamut of a low gray scale and increase color uniformity.

It is further still another object of the present disclosure to provide a display apparatus that can block external oxygen and moisture permeation with respect to an organic light emitting layer.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus including a substrate having a plurality of pixels having a plurality of subpixels, a pattern portion disposed on the substrate and formed to be concave between the plurality of subpixels, and a reflective pattern partially overlapped with a portion of the pattern portion on the pattern portion, in which the plurality of subpixels include a light emission area and a non-light emission area adjacent to the light emission area in which the reflective pattern is disposed, and the non-light emission area includes a first void between the light emission area and one side of the reflective pattern.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
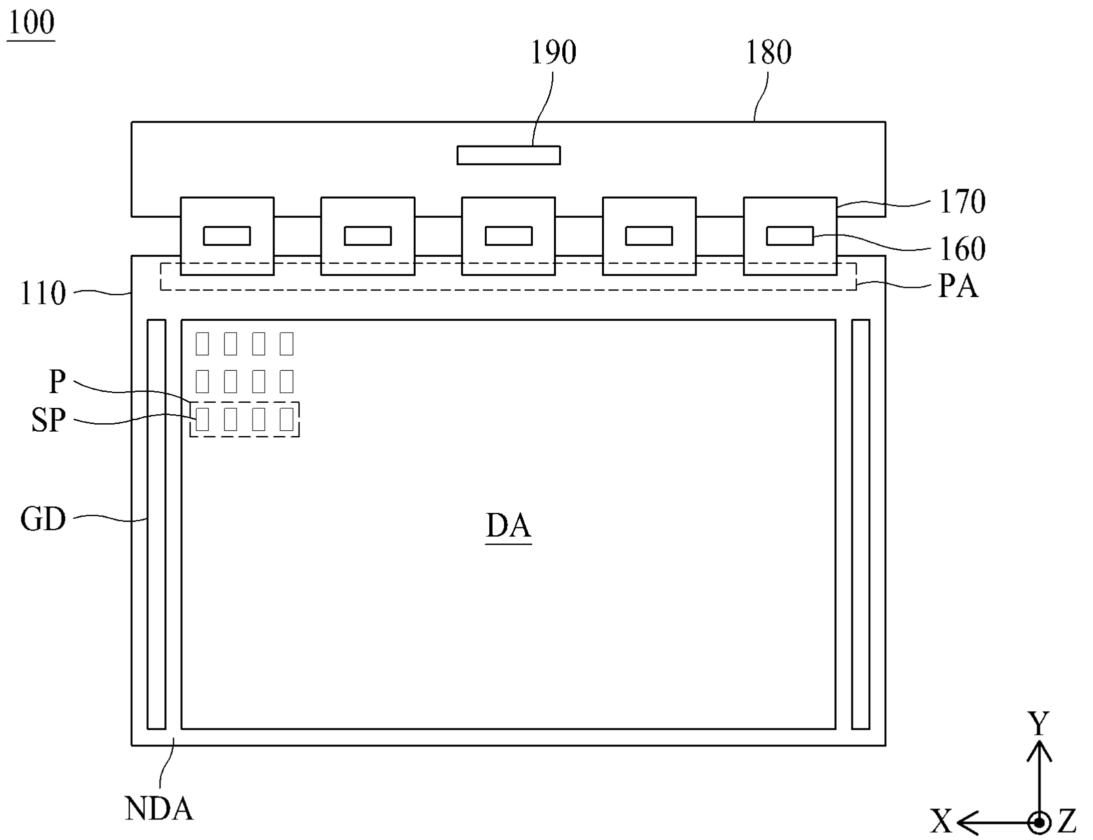
FIG. 1 is a schematic plan view illustrating a display apparatus according to an embodiment of the present disclosure.

Reference will now be made in detail to the embodiments of the present disclosure, examples of which are illustrated in the accompanying drawings.

Wherever possible, the same reference numbers will be used throughout the drawings to refer to the same or like parts.

Advantages and features of the present disclosure, and implementation methods thereof will be clarified through following embodiments described with reference to the accompanying drawings.

The present disclosure can, however, be embodied in different forms and should not be construed as limited to the embodiments set forth herein.

Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details.

Like reference numerals refer to like elements throughout. In the following description, when the detailed description of the relevant known function or configuration is determined to unnecessarily obscure the important point of the present disclosure, the detailed description will be omitted.

In a situation where "comprise," "have," and "include" described in the present specification are used, another part can be added unless "only" is used. The terms of a singular form can include plural forms unless referred to the contrary.

In construing an element, the element is construed as including an error range although there is no explicit description. In describing a position relationship, for example, when a position relation between two parts is described as "on," "over," "under," and "next," one or more other parts can be disposed between the two parts unless 'just' or 'direct' is used.

In describing a temporal relationship, for example, when the temporal order is described as "after," "subsequent," "next," and "before," a situation which is not continuous can be included, unless "just" or "direct" is used.

It will be understood that, although the terms "first," "second," etc. can be used herein to describe various elements, these elements should not be limited by these terms.

These terms are only used to distinguish one element from another. For example, a first element could be termed a second element, and, similarly, a second element could be termed a first element, without departing from the scope of the present disclosure.

Further, "X-axis direction," "Y-axis direction" and "Z-axis direction" should not be construed by a geometric relation only of a mutual vertical relation and can have broader directionality within the range that elements of the present disclosure can act functionally.

The term "at least one" should be understood as including any and all combinations of one or more of the associated listed items.

For example, the meaning of "at least one of a first item, a second item and a third item" denotes the combination of all items proposed from two or more of the first item, the second item and the third item as well as the first item, the second item or the third item.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in co-dependent relationship.

Hereinafter, the preferred embodiments of the present disclosure will be described in detail with reference to the accompanying drawings. All the components of each display apparatus according to all embodiments of the present disclosure are operatively coupled and configured.

Figure 2:
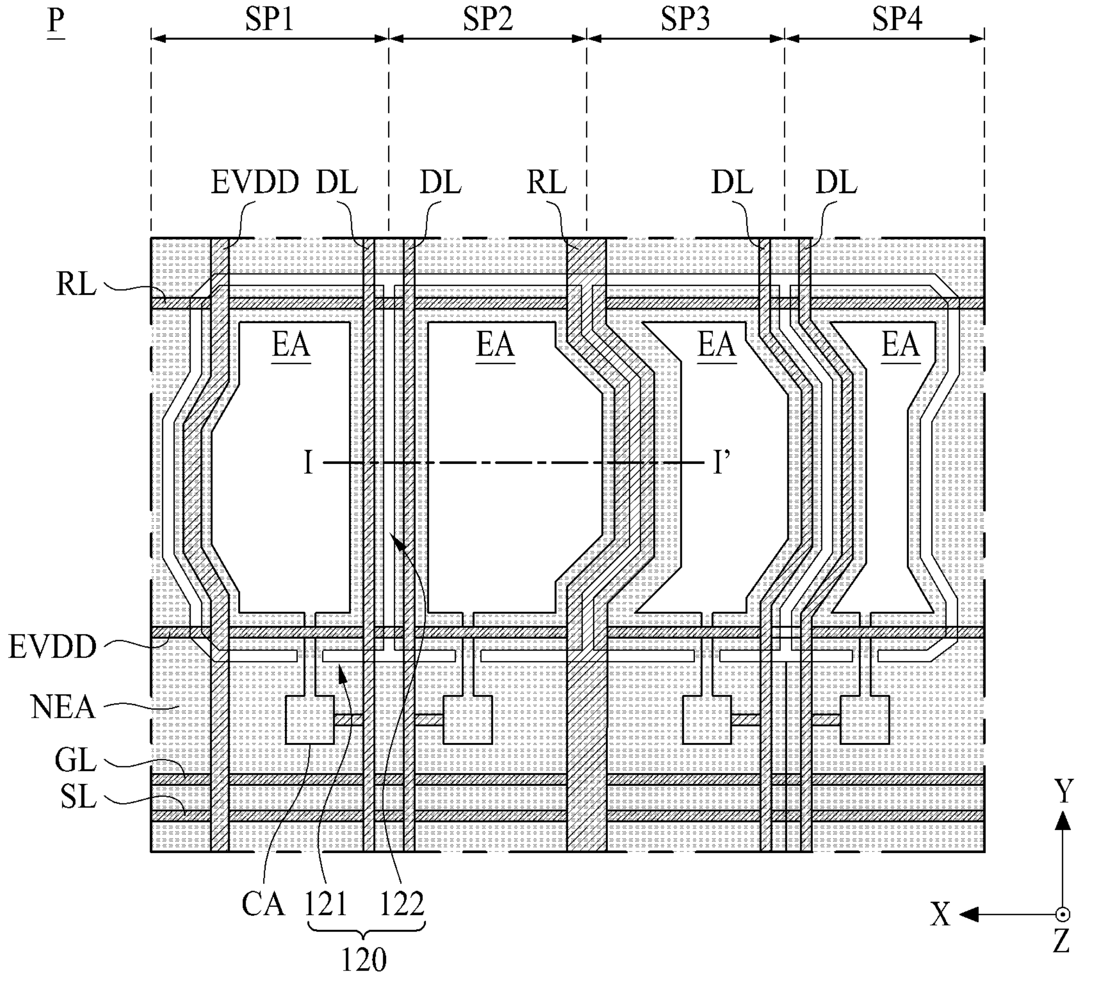
FIG. 2 is a schematic plan view illustrating one pixel shown in FIG. 1 according to an embodiment of the present disclosure.
Figure 3:
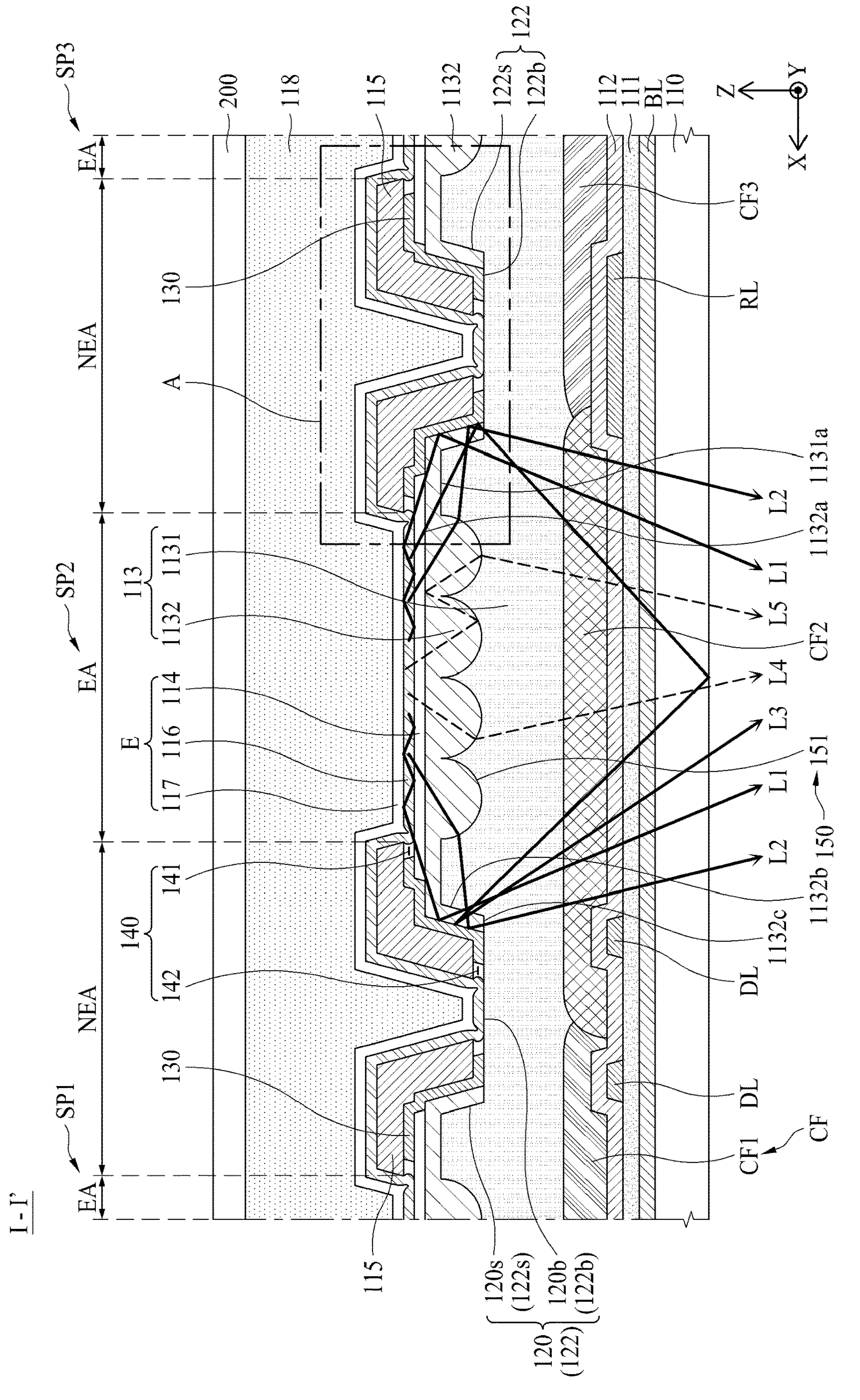
FIG. 3 is a schematic cross-sectional view taken along line I-I' shown in FIG. 2 according to an embodiment of the present disclosure.
Figure 4:
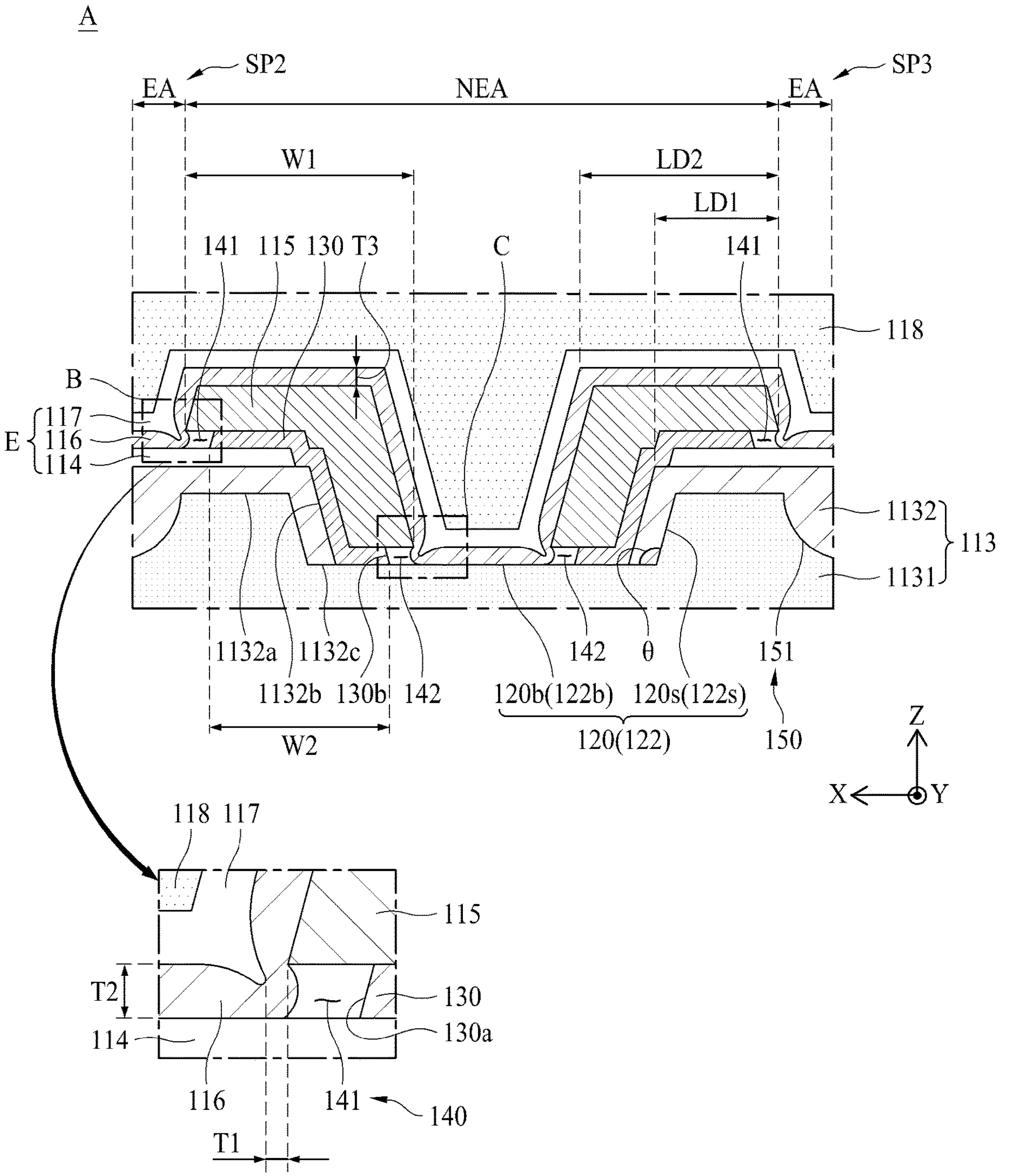
FIG. 4 is a schematic enlarged view illustrating a portion A shown in FIG. 3 according to an embodiment of the present disclosure.

FIG. 1 is a schematic plan view illustrating a display apparatus according to one embodiment of the present disclosure, FIG. 2 is a schematic plan view illustrating one pixel shown in FIG. 1 according to an embodiment of the present disclosure, FIG. 3 is a schematic cross-sectional view taken along line I-I' shown in FIG. 2 according to an embodiment of the present disclosure, and FIG. 4 is a schematic enlarged view illustrating a portion A shown in FIG. 3 according to an embodiment of the present disclosure.

Referring to FIGS. 1 to 4, a display apparatus 100 according to one embodiment of the present disclosure includes a substrate 110 having a plurality of pixels P having a plurality of subpixels SP, a pattern portion 120 disposed on the substrate 110 and formed to be concave between the plurality of subpixels SP, and a reflective pattern 130 partially overlapping a part of the pattern portion 120 on the pattern portion 120.

The plurality of subpixels SP can include a light emission area EA and a non-light emission area NEA adjacent to the light emission area EA, having a reflective pattern 130 disposed therein. The non-light emission area NEA can include a first void 141 between the light emission area EA and one side 130*a* of the reflective pattern 130.

The first void 141 according to one example can mean an empty space as shown in FIG. 3. For example, the first void 141 can be an undercut area. As the first void 141 is provided between the light emission area EA and one side 130*a* of the reflective pattern 130, a thickness of an organic light emitting layer 116 formed in the light emission area EA and the non-light emission area NEA in a subsequent process can be reduced by the first void 141. For example, the first void 141 can cause a portion of the organic light emitting layer 116 to be pinched or thinned. The decrease in the thickness of the organic light emitting layer 116 by the first void 141 can mean that a portion of the plurality of layers constituting the organic light emitting layer 116 is removed or disconnected by the first void 141. For example, when the organic light emitting layer 116 has a stack structure of a first stack, a charge generation layer and a second stack, the first stack and/or the charge generation layer, which are disposed at lower positions (or formed earlier), can be removed or disconnected due to the first void 141. Therefore, a portion of the plurality of layers constituting the organic light emitting layer 116 can be disconnected by the first void 141.

Therefore, in the display apparatus 100 according to one embodiment of the present disclosure, due to the formation of the first void 141 for reducing the thickness of the organic light emitting layer 116 or removing a portion of the organic light emitting layer 116, a current flow from a subpixel SP for emitting light toward an adjacent subpixel SP (or in a horizontal direction) can be minimized or blocked. For example, the first void 141 can help minimize or block leakage current between adjacent subpixels by causing a kink or a pinched portion to form in the organic light emitting layer 116. Therefore, in the display apparatus 100 according to one embodiment of the present disclosure, a color gamut can be enlarged in a low gray scale area having a low gray level. Also, the display apparatus 100 according to one embodiment of the present disclosure can minimize or block the flow of the current flowing from the subpixel SP for emitting light toward the adjacent subpixel SP (or in the horizontal direction), thereby allowing the current to flow in an upward direction (or in a vertical direction) of the subpixel SP for emitting light to enlarge a color gamut of a low gray scale or increasing color uniformity.

Meanwhile, in the display apparatus 100 according to one embodiment of the present disclosure, the first void 141 can be provided to surround the light emission area EA. As the display apparatus 100 according to one embodiment of the present disclosure includes the first void 141 surrounding the light emission area EA in the non-light emission area NEA, a thickness T1 (shown in FIG. 4) of the organic light emitting layer 116 adjacent to the first void 141 can be thinner than a thickness T2 (shown in FIG. 4) of the organic light emitting layer 116 that is not adjacent to the first void 141, for example, a thickness T2 (shown in FIG. 4) of the organic light emitting layer 116 in the light emission area EA (or a thickness T3 (shown in FIG. 4) of the organic light emitting layer 116 on the reflective pattern 130). Therefore, the display apparatus 100 according to one embodiment of the present disclosure can minimize or block the flow of the current toward the periphery of the light emission area EA of the subpixel SP for emitting light, thereby preventing color mixture with the adjacent subpixel SP from occurring. Therefore, the display apparatus 100 according to one embodiment of the present disclosure can increase color uniformity of the subpixel SP for emitting light.

Hereinafter, the display apparatus 100 according to one embodiment of the present disclosure will be described in detail with reference to FIGS. 1 to 4.

The plurality of subpixels SP can include a light emission area EA and a non-light emission area NEA adjacent to the light emission area EA. The light emission area EA is an area from which light is emitted, and can be expressed as a term of a display area. The non-light emission area NEA is an area from which light is not emitted, and can be expressed as a term of a non-display area or a peripheral area.

A pattern portion 120 can be disposed in the non-light emission area NEA (or near the non-light emission area NEA). The pattern portion 120 according to one example can be formed to be concave between the plurality of subpixels SP. For example, the pattern portion 120 can be a concaved area or a type of depression or groove that is formed between adjacent subpixels. Also, the pattern portion 120 can fully surround or partially surround the light emission area EA of a subpixel (e.g., similar to a moat or a ditch).

The reflective pattern 130 can be disposed in the non-light emission area NEA. The reflective pattern 130 can partially overlap with a portion of the pattern portion 120 on the pattern portion 120. For example, the reflective pattern 130 can be disposed on or coated along inclined side surfaces of the pattern portion 120. As shown in FIG. 3, the reflective pattern 130 according to one embodiment can be in contact with a portion of a bottom surface 120*b* of the pattern portion 120 while covering an edge of a pixel electrode 114 and an inclined surface 120*s* of the pattern portion 120. For example, the reflective pattern 130 can cover an edge of the pixel electrode 114 and extend from the edge of the pixel electrode to the bottom surface 120*b* of the pattern portion 120. The reflective pattern 130 can be spaced apart from a reflective electrode 117. For example, the reflective pattern 130 can be formed below a bank 115 at a width smaller than that of the bank 115. Also, the bank 115 can be disposed between the reflective electrode 117 and the reflective pattern 130. Therefore, the reflective pattern 130 can be disposed to be spaced apart from the reflective electrode 117. The reflective pattern 130 can be made of a material having high reflectance to reflect light emitted from the light emission area EA. For example, the reflective pattern 130 can be a metal, but embodiments are not limited thereto. For example, the reflective pattern 130 can be formed of multiple layers with different refractive indices, in which light can be reflected at interface between two different layers having different refractive indices.

In the display apparatus 100 according to one embodiment of the present disclosure, the reflective pattern 130 can be provided in the periphery of the non-light emission area NEA, whereby light, which is directed toward an adjacent subpixel SP, among the light emitted from the light emission area EA can be reflected toward the light emission area EA of a subpixel SP for emitting light. For example, the shape of the pattern portion 120 and the corresponding reflective pattern 130 can help funnel more light out of the display apparatus 100 towards a viewer. Therefore, the display apparatus 100 according to one embodiment of the present disclosure can improve light extraction efficiency of the subpixel SP for emitting light and reduce power consumption. In this situation, the periphery of the non-light emission area NEA can refer to a partial area of the non-light emission area NEA that is spaced apart from or adjacent to the light emission area EA. For example, the periphery of the non-emission area NEA can be an area spaced apart from the light emission area EA while surrounding the light emission area EA.

The pattern portion 120 according to one example can be formed to be concave in the periphery of the non-light emission area NEA. The pattern portion 120 can be a type of depression or groove formed in another layer, such as a first layer 1131 included in an overcoat layer 113. For example, the pattern portion 120 can be formed to be concave in the overcoat layer 113 (shown in FIG. 3) on the substrate 110. As shown in FIG. 2, the pattern portion 120 can be provided to fully surround the light emission area EA or at least partially surround the light emission area EA. The pattern portion 120 can be disposed to be spaced apart from the light emission area EA. In FIG. 2, point hatching (or shading) is used to indicate a bank. The pattern portion 120 according to one example can be provided to surround the light emission area EA in the form of a slit or a trench. For example, a width of the pattern portion 120 can be formed to be reduced from the reflective pattern 130 toward the substrate 110. For example, the pattern portion 120 can have a reverse tapered shape relative to the substrate 110 (e.g., a cross section of the pattern portion 120 can have a trapezoid shape). Also, as shown in FIG. 3, the pattern portion 120 can include an area that is exposed without being covered by the bank 115 (e.g., as shown in FIG. 3, a center of the pattern portion 120 is not covered by the bank 115). Therefore, the pattern portion 120 can be expressed as terms such as a groove, a depression, a slit, a trench, a bank slit and a bank trench.

The reflective pattern 130 according to one example can be formed along a profile of the pattern portion 120 formed to be concave near the non-light emission area NEA. For example, the reflective pattern 130 can be formed to cover an upper surface of the pixel electrode 114, the inclined surface 120*s* of the pattern portion 120 and a portion of the bottom surface 120*b* of the pattern portion 120. For example, the reflective pattern 130 can be disposed on or coated along inclined side surfaces of the pattern portion 120. As shown in FIG. 3, since the reflective pattern 130 is disposed to be inclined while surrounding the light emission area EA on the pattern portion 120, the reflective pattern 130 can be expressed as a term of a side reflective portion and an inclined reflective portion.

Meanwhile, the display apparatus 100 according to one embodiment of the present disclosure can be implemented in a bottom emission type in which light emitted from the light emission area EA is emitted to the lower surface of the substrate 110. Therefore, in the display apparatus 100 according to one embodiment of the present disclosure, the light emitted to the lower surface of the substrate 110 can be the light in which direct light emitted from the light emission area EA and directly emitted to the lower surface of the substrate 110 and reflective light obtained by reflecting the light, which is emitted from the light emission area EA and directed toward the adjacent subpixel SP, by the reflective pattern 130 and emitting the light to the lower surface of the substrate 110 are combined with each other. Therefore, the display apparatus 100 according to one embodiment of the present disclosure can better improve light extraction efficiency, improve image quality, and reduce power consumption than when compared to a display apparatus in which the reflective pattern 130 is not provided.

Also, in the display apparatus 100 according to one embodiment of the present disclosure, the first void 141 is provided below the bank 115 to be adjacent to the light emission area EA, so that a portion of the plurality of layers of the organic light emitting layer 116 formed in a subsequent process can be disconnected or thinned to reduce the thickness of the organic light emitting layer 116 adjacent to the first void 141. For example, the first void 141 can create a pinched portion or a kinked portion in the organic light emitting layer 116. Therefore, the display apparatus 100 according to one embodiment of the present disclosure can minimize or block the flow of the current for driving a pixel from the subpixel SP for emitting light to the adjacent subpixel SP, thereby improving a color gamut, that is, a color gamut of a low gray scale. For example, the first void 141 in the pattern portion 120 can help prevent or minimize current leakage between adjacent subpixels.

Referring to FIGS. 1 and 3, the display apparatus 100 according to one embodiment of the present disclosure can include a display panel having a gate driver GD, a light extraction portion 150 overlapping with the light emission area EA, a source drive integrated circuit (hereinafter, referred to as "IC") 160, a flexible film 170, a circuit board 180, and a timing controller 190.

The display panel can include a substrate 110 and an opposite substrate 200 (shown in FIG. 3).

The substrate 110 can include a thin film transistor, and can be a transistor array substrate, a lower substrate, a base substrate, or a first substrate. The substrate 110 can be a transparent glass substrate or a transparent plastic substrate. The substrate 110 can include a display area DA and a non-display area NDA.

The display area DA is an area where an image is displayed, and can be a pixel array area, an active area, a pixel array unit, a display unit, or a screen. For example, the display area DA can be disposed at a central portion of the display panel. The display area DA can include a plurality of pixels P.

The opposite substrate 200 can encapsulate (or seal) the display area DA disposed on the substrate 110. For example, the opposite substrate 200 can be bonded to the substrate 110 via an adhesive member (or clear glue). The opposite substrate 200 can be an upper substrate, a second substrate, or an encapsulation substrate.

The gate driver GD supplies gate signals to the gate lines in accordance with the gate control signal input from the timing controller 190. The gate driver GD can be formed on one side of the display area DA or in the non-display area NDA outside both sides of the display area DA in a gate driver in panel (GIP) method, as shown in FIG. 1.

The non-display area NDA is an area on which an image is not displayed, and can be a peripheral area, a signal supply area, an inactive area or a bezel area. The non-display area NDA can be configured to be in the vicinity of the display area DA. That is, the non-display area NDA can be disposed to surround the display area DA.

A pad area PA can be disposed in the non-display area NDA. The pad area PA can supply a power source and/or a signal for outputting an image to the pixel P provided in the display area DA. Referring to FIG. 1, the pad area PA can be provided above the display area DA.

The source drive IC 160 receives digital video data and a source control signal from the timing controller 190. The source drive IC 160 converts the digital video data into analog data voltages in accordance with the source control signal and supplies the analog data voltages to the data lines. When the source drive IC 160 is manufactured as a driving chip, the source drive IC 160 can be packaged in the flexible film 170 in a chip on film (COF) method or a chip on plastic (COP) method.

Pads, such as data pads, can be formed in the non-display area NDA of the display panel. Lines connecting the pads with the source drive IC 160 and lines connecting the pads with lines of the circuit board 180 can be formed in the flexible film 170. The flexible film 170 can be attached onto the pads by using an anisotropic conducting film, whereby the pads can be connected with the lines of the flexible film 170.

The circuit board 180 can be attached to the flexible films 170. A plurality of circuits implemented as driving chips can be packaged in the circuit board 180. For example, the timing controller 190 can be packaged in the circuit board 180. The circuit board 180 can be a printed circuit board or a flexible printed circuit board.

The timing controller 190 receives the digital video data and a timing signal from an external system board through a cable of the circuit board 180. The timing controller 190 generates a gate control signal for controlling an operation timing of the gate driver GD and a source control signal for controlling the source drive ICs 160 based on the timing signal. The timing controller 190 supplies the gate control signal to the gate driver GD, and supplies the source control signal to the source drive ICs 160.

Referring to FIGS. 2 and 3, the substrate 110 according to an example can include the light emission area EA and the non-light emission area NEA.

The light emission area EA according to an example can include gate lines, data lines, pixel driving power lines, and a plurality of pixels P. Each of the plurality of pixels P can include a plurality of subpixels SP that can be defined by the gate lines and the data lines.

Meanwhile, at least four subpixels, which are provided to emit different colors and disposed to be adjacent to one another, among the plurality of subpixels SP can constitute one pixel P (or unit pixel). One pixel P can include, but is not limited to, a red subpixel, a green subpixel, a blue subpixel and a white subpixel. One pixel P can include three subpixels SP provided to emit light of different colors and disposed to be adjacent to one another. For example, one pixel P can include a red subpixel, a green subpixel and a blue subpixel.

Each of the plurality of subpixels SP includes a thin film transistor and a light emitting element layer E connected to the thin film transistor. Each of the plurality of subpixels can include an organic light emitting layer (or a light emitting layer) interposed between the pixel electrode and the reflective electrode.

The organic light emitting layers respectively disposed in the plurality of subpixels SP can individually emit light of different colors or commonly emit white light. According to one embodiment, when the organic light emitting layers of the plurality of subpixels SP commonly emit white light, each of a red subpixel, a green subpixel and a blue subpixel can include a color filter CF (or a wavelength conversion member CF) for converting the white light into light of another color. In this situation, the white subpixel according to one example may not include a color filter.

In the display apparatus 100 according to one embodiment of the present disclosure, an area provided with a red color filter can be a red subpixel or a first subpixel, an area provided with a green color filter can be a green subpixel or a second subpixel, an area provided with a blue color filter can be a blue subpixel or a third subpixel, and an area in which the color filter is not provided can be a white subpixel or a fourth subpixel.

Each of the subpixels SP supplies a predetermined current to the organic light emitting element in accordance with a data voltage of the data line when a gate signal is input from the gate line by using the thin film transistor. For this reason, the light emitting layer of each of the subpixels can emit light with a predetermined brightness in accordance with the predetermined current.

The plurality of subpixels SP according to one example can be disposed to be adjacent to each other in a first direction (X-axis direction). The first direction (X-axis direction) can be a horizontal direction based on FIG. 2. The horizontal direction can be a direction in which a gate line GL is disposed.

A second direction (Y-axis direction) is a direction crossing the first direction (X-axis direction), and can be a vertical direction based on FIG. 2. The vertical direction can be a direction in which a data line DL is disposed.

A third direction (Z-axis direction) is a direction crossing each of the first direction (X-axis direction) and the second direction (Y-axis direction), and can be a thickness direction of the display apparatus 100.

The plurality of subpixels SP can include a first subpixel SP1, a second subpixel SP2, a third subpixel SP3 and a fourth subpixel SP4 arranged adjacent to each other in the first direction (X-axis direction). For example, the first subpixel SP1 can be a red subpixel, the second subpixel SP2 can be a green subpixel, the third subpixel SP3 can be a blue subpixel and the fourth subpixel SP4 can be a white subpixel, but is not limited thereto. However, the arrangement order of the first subpixel SP1, the second subpixel SP2, the third subpixel SP3 and the fourth subpixel SP4 can be changed.

Each of the first to fourth subpixels SP1 to SP4 can include a light emission area EA and a circuit area CA. The light emission area EA can be disposed at one side (or an upper side) of a subpixel area, and the circuit area can be disposed at the other side (or a lower side) of the subpixel area. For example, the circuit area CA can be disposed at the lower side of the light emission area EA based on the second direction Y. The light emission areas EA of the first to fourth subpixels SP1 to SP4 can have different sizes (or areas) as each other.

The first to fourth subpixels SP1 to SP4 can be disposed to be adjacent to one another along the first direction (X-axis direction). For example, two data lines DL extended along the second direction (Y-axis direction) can be disposed in parallel with each other between the first subpixel SP1 and the second subpixel SP2 and between the third subpixel SP3 and the fourth subpixel SP4. A pixel power line EVDD extended along the first direction (X-axis direction) can be disposed between the light emission area EA and the circuit area CA of each of the first to fourth subpixels SP1 to SP4. The gate line GL and a sensing line SL can be disposed below the circuit area CA. The pixel power line EVDD extended along the second direction (Y-axis direction) can be disposed at one side of the first subpixel SP1 or the fourth subpixel SP4. A reference line RL extended along the second direction (Y-axis direction) can be disposed between the second subpixel SP2 and the third subpixel SP3. The reference line RL can be used as a sensing line for sensing a change of characteristics of a driving thin film transistor and/or a change of characteristics of the light emitting element layer, which is disposed in the circuit area, from the outside in a sensing driving mode of the pixel P.

In the display apparatus 100 according to one embodiment of the present disclosure, each of the plurality of subpixels SP can include a light extraction portion 150. The light extraction portion 150 can be formed in an overcoat layer 113 (shown in FIG. 3) so that it partially overlaps with the light emission area EA and is disposed to be adjacent to the pattern portion 120. The light extraction portion 150 can be formed on the overcoat layer 113 of the light emission area EA to have a curved (or uneven) shape, thereby changing a propagation path of light emitted from the light emitting element layer E to increase light extraction efficiency. For example, the light extraction portion 150 can be a non-flat portion, an uneven pattern portion, a micro lens portion, or a light scattering pattern portion.

The light extraction portion 150 can include a plurality of concave portions 151. The plurality of concave portions 151 can be formed to be concave inside the overcoat layer 113. For example, the plurality of concave portions 151 can be formed or configured to be concave from an upper surface 1131*a* of a first layer 1131 included in the overcoat layer 113. Therefore, the first layer 1131 can include a plurality of concave portions 151. The first layer 1131 can be disposed between the substrate 110 and the light emitting element layer E.

A second layer 1132 of the overcoat layer 113 can be disposed between the first layer 1131 and a light emitting element layer E (or a pixel electrode 114 shown in FIG. 3). For example, the second layer 1132 can be disposed in the plurality of concave portions 151 of the first layer 1131. The second layer 1132 according to one example can be formed to be wider than the pixel electrode 114 in a first direction (X-axis direction). Thus, the second layer 1132 can partially overlap with the light emissive area EA. However, it is not necessarily limited to this.

In the display apparatus 100 according to one embodiment of the present disclosure, an upper surface 1132*a* of a second layer 1132 can be provided to be flat. The pixel electrode 114 is formed on the upper surface 1132*a* of the second layer 1132, so that the pixel electrode 114 can be also provided to be flat. The organic light emitting layer 116 and the reflective electrode 117, which are formed on the pixel electrode 114, can be also provided to be flat. As the pixel electrode 114, the organic light emitting layer 116, the reflective electrode 117, that is, the light emitting element layer E are provided to be flat in the light emission area EA, a thickness of each of the pixel electrode 114, the organic light emitting layer 116 and the reflective electrode 117 can be uniformly formed in the light emission area EA. Therefore, the organic light emitting layer 116 can uniformly emit light without deviation in the light emission area EA, which can improve image quality and can improve the viewing angle.

Also, an upper surface 1132*a* of the second layer 1132 can be provided to be flat so that the pixel electrode 114 can be provided to be flat, whereby occurrence of a radial rainbow pattern and a radial circular ring pattern due to reflection of external light can be suppressed or minimized as compared with the situation that a pixel electrode is formed in a curved shape or an uneven shape.

For example, in a display apparatus in which a pixel electrode is provided to be flat, incident external light can be linearly polarized through a polarizing plate and changed to right circularly polarized light while passing through a λ/4 retarder, and the rightly circularly polarized light can be reflected once on the pixel electrode (or the reflective electrode) and changed to left circularly polarized light by a phase change of 180°. The left circularly polarized light can be linearly polarized to be opposite to the incident light while passing through the λ/4 retarder again, and then can become the same as an absorption axis of the polarizing plate and thus can be absorbed into the polarizing plate.

However, in the display apparatus that includes a pixel electrode (or a reflective electrode) formed in a curved shape or an uneven shape, due to curve of the pixel electrode (or the reflective electrode), external light is reflected twice on the pixel electrode (or the reflective electrode) so that a phase is additionally changed as much as 180° as compared with the situation that the external light is reflected once, whereby the incident light and the output light have the same phase by passing through the retarder and thus pass through the polarizing plate. Therefore, in the display apparatus that includes a pixel electrode formed in a curved shape or an uneven shape, reflectance of external light can be increased to generate a radial rainbow pattern and a radial circular ring pattern (e.g., a moire defect), and black visibility can be deteriorated or black gap can occur.

Therefore, in the display apparatus 100 according to one embodiment of the present disclosure, the upper surface 1132*a* of the second layer 1132 can be provided to be flat so that the pixel electrode 114 can be provided to be flat, whereby occurrence of a radial rainbow pattern and a radial circular ring pattern due to reflection of external light can be suppressed or minimized as compared with the situation that the pixel electrode (or the reflective electrode) is formed in a curved shape or an uneven shape, and real black visibility can be implemented in a non-driving or off state or black gap can be improved.

Meanwhile, in the display apparatus 100 according to one embodiment of the present disclosure, the light extraction portion 150, which includes the plurality of concave portions 151, can be formed to overlap with the light emission area EA, instead of the pixel electrode 114 (or the reflective electrode 117) being provided to be flat, whereby occurrence of the rainbow pattern and the circular ring pattern can be suppressed and light extraction efficiency of the light emitted from the light emission area can be improved.

Meanwhile, a refractive index of the second layer 1132 can be greater than that of the first layer 1131. Therefore, as shown in FIG. 3, a path of a portion of the light emitted from the organic light emitting layer 116 and directed toward the substrate 110 can be changed toward the reflective pattern 130 due to a difference in refractive index between the second layer 1132 and the first layer 1131 of the light extraction portion 150. Therefore, the light having a path formed toward the reflective pattern 130 by the light extraction portion 150 can be reflected by the reflective pattern 130 and then output toward the light emission area EA of the subpixel SP for emitting light. Hereinafter, the light reflected by the reflective pattern 130 and then output to the substrate 110 will be defined as reflective light.

As shown in FIG. 3, the reflective light can include first reflective light L1 (or waveguide mode extraction light L1) reflected from the reflective pattern 130 and emitted to the substrate 110 after being subjected to optical waveguide through total reflection between the pixel electrode 114 and the reflective electrode 117, second reflective light L2 reflected from the reflective pattern 130 and emitted to the substrate 110 after its path is changed by the light extraction portion 150, and third reflective light L3 (or substrate mode extraction light L3) primarily reflected by the reflective pattern 130 after being emitted from the organic light emitting layer 116, secondarily reflected on a boundary surface between a lower surface of the substrate 110 and an air layer and thirdly reflected by the reflective pattern 130 and then emitted to the substrate 110. The first reflective light L1, the second reflective light L2 and the third reflective light L3, which are shown in solid lines in FIG. 3, can be the reflective light extracted by being reflected by the reflective pattern 130.

As shown in FIG. 3, the first reflective light L1 according to one example can be emitted from the light emission area EA. The second reflective light L2 can be emitted from a position spaced apart from the light emission area EA. That is, the second reflective light L2 can be emitted from the non-light emission area NEA or a peripheral area. For example, the second reflective light L2 can be emitted toward the substrate 110 from the position spaced apart from the light emission area EA, but is not limited thereto. The first reflective light L1 can be emitted toward the substrate 110 from the position spaced apart from the light emission area EA. The third reflective light L3 can be emitted from the light emission area EA or the non-light emission area NEA.

Meanwhile, the display apparatus 100 according to one embodiment of the present disclosure can further include light which is output to the substrate 110 through the light extraction portion 150 without being reflected by the reflective pattern 130. For example, as shown in FIG. 3, the display apparatus 100 can further include first extraction light L4 emitted from the organic light emitting layer 116, refracted on a boundary surface (or a plurality of concave portions 151 included in the light extraction portion 150) between the second layer 1132 and the first layer 1131 and then output to the substrate 110, and recycle light L5 emitted from the organic light emitting layer 116, primarily reflected on the boundary surface (or the plurality of concave portions 151 included in the light extraction portion 150) between the second layer 1132 and the first layer 1131 and then secondarily reflected on the lower surface of the pixel electrode 114, refracted on the boundary surface (or the plurality of concave portions 151 included in the light extraction portion 150) between the second layer 1132 and the first layer 1131 and output to the substrate 110. Therefore, the display apparatus 100 according to one embodiment of the present disclosure can improve overall light extraction efficiency through the light extraction portion 150 and the reflective pattern 130 and power consumption can be reduced.

In the display apparatus 100 according to one embodiment of the present disclosure, since the pattern portion 120 is disposed to surround the light emission area EA, at least a portion of the reflective pattern 130 on the pattern portion 120 can be disposed to surround the light emission area EA. Therefore, the reflective light can be emitted toward the substrate 110 from the position spaced apart from the light emission area EA while surrounding at least a portion of the light emission area EA.

Referring to FIG. 4, in the display apparatus 100 according to one embodiment of the present disclosure, the reflective pattern 130 disposed to be inclined on the pattern portion 120 can be disposed to be closer to the light emission area EA than the reflective electrode 117 disposed to be inclined on the pattern portion 120. In other words, an inclined surface of the reflective electrode 117 that is on the pattern portion 120 can be spaced farther away from the light emission area EA than an inclined surface of the reflective pattern 130 this is on the pattern portion 120. For example, as shown in FIG. 4, a first distance LD1 from the light emission area EA to the inclined reflective pattern 130 can be shorter than a second distance LD2 from the light emission area EA to the inclined reflective electrode 117. Therefore, in the display apparatus 100 according to one embodiment of the present disclosure, since the light emitted from the light emission area EA can be reflected from the inclined reflective pattern 130 below the bank 115 without moving to the inclined reflective electrode 117, a reflective path becomes short, whereby light extraction efficiency can be increased.

Meanwhile, in the display apparatus 100 according to one embodiment of the present disclosure, the bank 115 can be provided as a transparent bank. However, as described above, the light emitted from the light emission area EA can be reflected by the reflective pattern 130 without passing through the bank 115. Therefore, in the display apparatus 100 according to another embodiment of the present disclosure, the bank 115 can be provided as a black bank (e.g., the bank 115 can include a black material and function as a black matrix). When the bank 115 in the non-light emission area NEA is provided as a black bank, reflection of external light on the reflective electrode 117 and/or the circuit portion can be reduced, whereby black visibility can be improved during non-driving of the display area DA.

Hereinafter, a structure of each of the plurality of subpixels SP will be described in detail.

Referring to FIG. 3, the display apparatus 100 according to one embodiment of the present disclosure can further include a buffer layer BL, a circuit element layer, a thin film transistor, a pixel electrode 114, a bank 115, an organic light emitting layer 116, a reflective electrode 117, an encapsulation layer 118 and a color filter CF.

In more detail, each of the subpixels SP according to one embodiment can include a circuit element layer provided on an upper surface of a buffer layer BL, including a gate insulating layer, an interlayer insulating layer 111 and a passivation layer 112, an overcoat layer 113 provided on the circuit element layer, a pixel electrode 114 provided on the overcoat layer 113, a bank 115 covering an edge of the pixel electrode 114, an organic light emitting layer 116 on the pixel electrode 114 and the bank 115, a reflective electrode 117 on the organic light emitting layer 116, and an encapsulation layer 118 on the reflective electrode 117.

The thin film transistor for driving the subpixel SP can be disposed on the circuit element layer. The circuit element layer can be expressed in terms of an inorganic film layer. The pixel electrode 114, the organic light emitting layer 116 and the reflective electrode 117 can be included in the light emitting element layer E.

The buffer layer BL can be formed between the substrate 110 and the gate insulating layer to protect the thin film transistor. The buffer layer BL can be disposed on the entire surface (or front surface) of the substrate 110. The reference line RL for pixel driving can be disposed between the buffer layer BL and the passivation layer 112. The buffer layer BL can serve to block diffusion of a material contained in the substrate 110 into a transistor layer during a high temperature process of a manufacturing process of the thin film transistor. Optionally, the buffer layer BL can be omitted in some situations.

The thin film transistor (or a drive transistor) according to an example can include an active layer, a gate electrode, a source electrode, and a drain electrode. The active layer can include a channel area, a drain area and a source area, which are formed in a thin film transistor area of a circuit area of the subpixel SP. The drain area and the source area can be spaced parallel to each other with the channel area interposed therebetween.

The active layer can be formed of a semiconductor material based on any one of amorphous silicon, polycrystalline silicon, oxide and organic material.

The gate insulating layer can be formed on the channel area of the active layer. As an example, the gate insulating layer can be formed in an island shape only on the channel area of the active layer, or can be formed on an entire front surface of the substrate 110 or the buffer layer BL, which includes the active layer.

The gate electrode can be formed on the gate insulating layer to overlap with the channel area of the active layer.

The interlayer insulating layer 111 can be formed to partially overlap with the gate electrode and the drain area and source area of the active layer. The interlayer insulating layer 111 can be formed over the entire light emission area where light is emitted in the circuit area and the subpixel SP.

The source electrode can be electrically connected to the source area of the active layer through a source contact hole provided in the interlayer insulating layer overlapped with the source area of the active layer. The drain electrode can be electrically connected to the drain area of the active layer through a drain contact hole provided in the interlayer insulating layer 111 overlapped with the drain area of the active layer.

The drain electrode and the source electrode can be made of the same metal material. For example, each of the drain electrode and the source electrode can be made of a single metal layer, a single layer of an alloy or a multi-layer of two or more layers, which is the same as or different from that of the gate electrode.

In addition, the circuit area can further include first and second switching thin film transistors disposed together with the thin film transistor, and a capacitor. Since each of the first and second switching thin film transistors is provided on the circuit area of the subpixel SP to have the same structure as that of the thin film transistor, its description will be omitted. The capacitor can be provided in an overlap area between the gate electrode and the source electrode of the thin film transistor, which overlap with each other with the interlayer insulating layer 111 interposed therebetween.

Additionally, in order to prevent a threshold voltage of the thin film transistor provided in a pixel area from being shifted by light, the display panel or the substrate 110 can further include a light shielding layer provided below the active layer of at least one of the thin film transistor, the first switching thin film transistor or the second switching thin film transistor. The light shielding layer can be disposed between the substrate 110 and the active layer to shield light incident on the active layer through the substrate 110, thereby minimizing a change in the threshold voltage of the transistor due to external light. Also, since the light shielding layer is provided between the substrate 110 and the active layer, the thin film transistor can be prevented from being seen by a user (e.g., reflections off of the thin film transistor can be prevented or blocked from the viewer).

The passivation layer 112 can be provided on the substrate 110 to cover the pixel area. The passivation layer 112 covers a drain electrode, a source electrode and a gate electrode of the thin film transistor, and the buffer layer. The reference line can be disposed between the passivation layer 112 and the interlayer insulating layer 111. The reference line can be disposed at a position symmetrical to the pixel power line based on the light emission area EA or a similar position symmetrical to the pixel power line (e.g., see FIG. 2). Therefore, the reference line and the pixel power line can be disposed below the bank 115 without covering the light emitting area EA. The passivation layer 112 can be formed over the circuit area and the light emission area. The passivation layer 112 can be omitted. The color filter CF can be disposed on the passivation layer 112.

The overcoat layer 113 can be provided on the substrate 110 to cover the passivation layer 112 and the color filter CF. When the passivation layer 112 is omitted, the overcoat layer 113 can be provided on the substrate 110 to cover the circuit area. The overcoat layer 113 can be formed in the circuit area in which the thin film transistor is disposed and the light emission area EA. In addition, the overcoat layer 113 can be formed in the other non-display area NDA except a pad area PA of the non-display area NDA and the entire display area DA. For example, the overcoat layer 113 can include an extension portion (or an enlarged portion) extended or enlarged from the display area DA to the other non-display area NDA except the pad area PA. Therefore, the overcoat layer 113 can have a size that is relatively wider than a size of the display area DA.

The overcoat layer 113 according to one example can be formed to have a relatively thick thickness, thereby providing a flat surface on the display area DA and the non-display area NDA. For example, the overcoat layer 113 can be made of an organic material such as photo acryl, benzocyclobutene, polyimide and fluorine resin.

Figure 5:
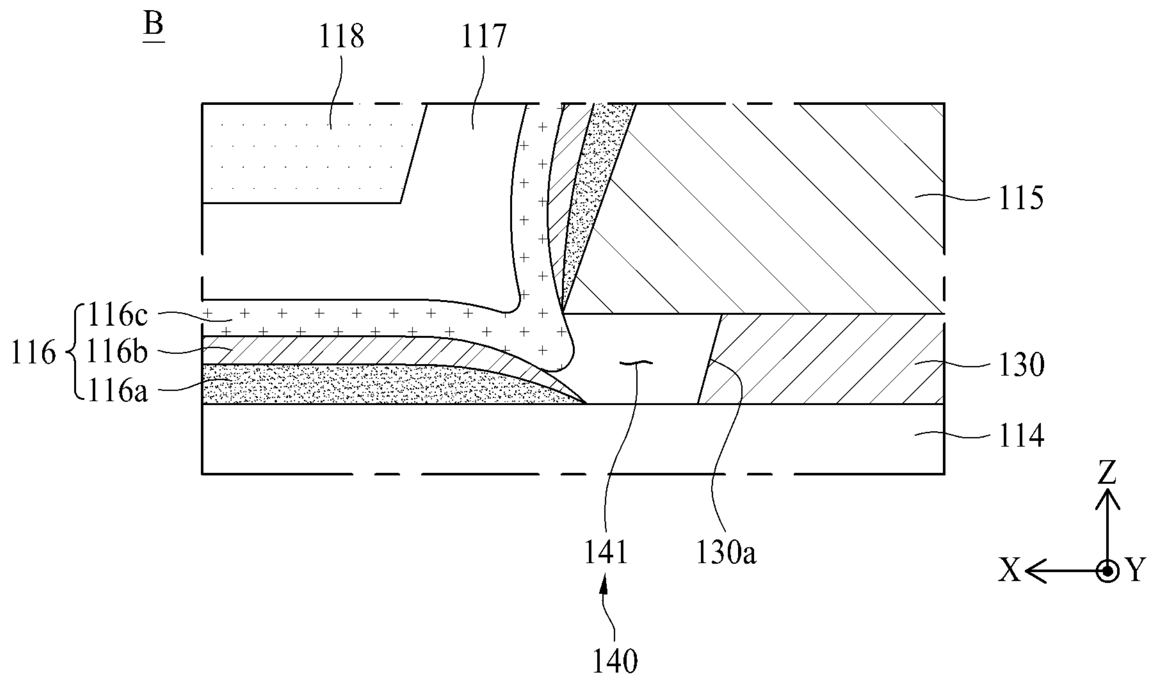
FIG. 5 is a schematic enlarged view illustrating a portion B shown in FIG. 4 according to an embodiment of the present disclosure.

The overcoat layer 113 formed in the display area DA (or the light emission area EA) can include a plurality of concave portions 151. The plurality of concave portions 151 are the elements of the light extraction portion 150 for increasing light efficiency of the light emission area EA, and can be formed inside the overcoat layer 113. In detail, as shown in FIG. 5, the plurality of concave portions 151 can be formed in a concave shape on the first layer 1131 of the overcoat layer 113. The plurality of concave portions 151 are provided to be connected to each other so that an embossed shape (or in the form of a plurality of consecutive lenses) can be formed in the first layer 1131.

The second layer 1132 having a refractive index higher than that of the first layer 1131 can be formed on the first layer 1131. A path of the light, which is directed toward the adjacent subpixel SP, among the light emitted from the light emitting element layer E can be changed toward the reflective pattern 130 (or toward the light emission area (EA)) in accordance with a difference in the refractive index between the second layer 1132 and the first layer 1131. The second layer 1132 can be provided to cover the embossed shape (or in the form of a plurality of consecutive lenses) of the first layer 1131 and thus the upper surface 1132*a* can be provided to be flat.

The plurality of concave portions 151 can be formed on the first layer 1131 through a photo process using a mask having an opening portion and then a pattern (or etching) or ashing process after the first layer 1131 is coated to cover the passivation layer 111*c* and the color filter CF. The plurality of concave portions 151 can be formed in an area overlapped with the color filter CF and/or an area that is not overlapped with the bank 115 of the light emission area EA, but are not limited thereto. A portion of the plurality of concave portions 151 can be formed to overlap the bank 115.

Referring back to FIG. 3, the color filter CF disposed in the light emission area EA can be provided between the substrate 110 and the overcoat layer 113. Therefore, the color filter CF can be disposed between the pixel power line, for example, the data line DL and the reflective pattern 130 or between the reference line RL and the pattern portion 120. The color filter CF can include a red color filter (or a first color filter) CF1 for converting white light emitted from the organic light emitting layer 116 into red light, a green color filter (or a second color filter) CF2 for converting white light into green light, and a blue color filter (or a third color filter) CF3 for converting white light into blue light. The fourth subpixel, which is a white subpixel, may not include a color filter since the light emitting layer 116 emits white light.

As shown in FIG. 3, the display apparatus 100 according to one embodiment of the present disclosure can be provided such that color filters having different colors partially overlap with each other at a boundary portion of the plurality of subpixels SP. For example, overlapping portions of different colors can be disposed between adjacent subpixels to function similar to a black matrix. In this situation, the display apparatus 100 according to one embodiment of the present disclosure can prevent the light emitted from each subpixel SP from being emitted to the adjacent subpixel SP due to the color filters overlapped with each other at the boundary portion of the subpixels SP, thereby preventing color mixture between the subpixels SP from occurring.

The pixel electrode 114 of the subpixel SP can be formed on the overcoat layer 113. According to one embodiment, as shown in FIG. 3, the pixel electrode 114 can partially overlap the reflective pattern 130 between the substrate 110 and the reflective pattern 130. This is because that the reflective pattern 130 covers the edge of the pixel electrode 114. The pixel electrode 114 can be connected to a drain electrode or a source electrode of a thin film transistor through a contact hole passing through the overcoat layer 113 and the passivation layer 112.

Because the display apparatus 100 according to an embodiment of the present disclosure is configured as the bottom emission type, the pixel electrode 114 can be formed of a transparent conductive material (or TCO), such as indium tin oxide (ITO) or indium zinc oxide (IZO) capable of transmitting light, or a semi-transmissive conductive material such as magnesium (Mg), silver (Ag), or an alloy of Mg and Ag.

Meanwhile, the material constituting the pixel electrode 114 can include MoTi. The pixel electrode 114 can be a first electrode or an anode electrode.

The bank 115 is an area from which light is not emitted, and can be provided to surround each of the light emitting portions (or the concave portions 151) of each of the plurality of subpixels SP. That is, the bank 115 can partition (or define) the concave portions 151 of each of the light emitting portion or the subpixels SP. The light emitting portion can mean a portion where the pixel electrode 114 and the reflective electrode 117 are in contact with each of the upper surface and the lower surface of the light emitting layer 116 with the light emitting layer 116 interposed therebetween.

The bank 115 can be formed to cover the reflective pattern 130 covering each edge of the pixel electrode 114. In this situation, the bank 115 can be disposed above the edge of the pixel electrode 114. For example, as shown in FIG. 3, the bank 115 can be more protruded toward the light emission area EA than the reflective pattern 130 and thus can be disposed on the edge of the pixel electrode 114. As the bank 115 is more protruded than the reflective pattern 130 toward the light emission area EA, the first void 141 adjacent to one side 130*a* of the reflective pattern 130 can be formed below the bank 115 (or between the bank 115 and the pixel electrode 114).

As shown in FIG. 4, the bank 115 can have one side more protruded than one side 130*a* of the reflective pattern 130 toward the light emission area EA and the other side formed to be more protruded than the other side 130*b* of the reflective pattern 130 toward the adjacent subpixel SP. This can be formed through the following manufacturing process. First, the bank 115 is patterned such that the bank 115 is disposed on the edge of the pixel electrode 114 and the inclined surface 120*s* of the pattern portion 120 after a material constituting the reflective pattern 130 is entirely deposited on the pixel electrode 114. Then, a portion of the material constituting the reflective pattern 130 is etched by performing a wet etching process to form the reflective pattern 130 having a width narrower than that of the bank 115. For example, the wet etching process of the reflective pattern 130 can form an undercut area or an overhang area of the bank 115 corresponding to the first void 141. In this situation, the bank 115 on the reflective pattern 130 can serve as an anti-etching layer for preventing the material constituting the reflective pattern 130 from being fully etched. Therefore, as shown in FIG. 4, the reflective pattern 130 can be formed inside the bank 115. An area in which the material of the reflective pattern 130 below the bank 115 is etched can be the first void 141. Therefore, in the display apparatus 100 according to one embodiment of the present disclosure, the bank 115 can be disposed on the reflective pattern 130 and the first void 141, and a width W1 of the bank 115 can be greater than a width W2 of the reflective pattern 130. For example, the bank 115 can have overhang portions or eave portions that correspond to opposite sides of the reflective pattern 130. Therefore, the first void 141 adjacent to one side 130*a* of the reflective pattern 130 can be formed below the bank 115. Therefore, as shown in FIG. 3, the first void 141 can be disposed between the organic light emitting layer 116 and the reflective pattern 130 below the bank 115. In addition, since the first void 141 is disposed below the bank 115, the first void 141 can be formed along the edge of the bank 115.

Meanwhile, as the bank 115 is disposed between the edge of the pixel electrode 114 and the reflective electrode 117, the pixel electrode 114 and the reflective electrode 117 can be prevented from being in contact with each other at each end of the pixel electrode 114. As shown in FIG. 3, a portion of the pixel electrode 114 can be exposed without being covered by the bank 115. The exposed portion of the pixel electrode 114, which is not covered by the bank 115, can be included in a light emitting portion (or the light emission area EA). As shown in FIG. 3, since the light emitting portion can be formed on the plurality of concave portions 151, the light emitting portion (or the light emission area EA) can overlap with the concave portions 151 in a thickness direction (or a third direction (Z-axis direction)) of the substrate 110.

After the bank 115 is formed, the organic light emitting layer 116 can be formed on the light emission area EA and the non-light emission area NEA. In detail, the organic light emitting layer 116 can be formed to cover the pixel electrode 114 and the bank 115. Therefore, the organic light emitting layer 116 can be disposed on the pixel electrode 114 and the bank 115. In this situation, a portion of the bank 115 can be provided between the pixel electrode 114 and the organic light emitting layer 116 in the non-light emission area NEA. The bank 115 can be expressed as a term of a pixel defining layer. The bank 115 according to one example can include an organic material and/or an inorganic material. As shown in FIG. 3, the bank 115 can be formed to be inclined along the profile of the pattern portion 120 (or the reflective pattern 130).

Referring back to FIG. 3, the organic light emitting layer 116 can be formed on the pixel electrode 114 and the bank 115. The organic light emitting layer 116 can be provided between the pixel electrode 114 and the reflective electrode 117. When a voltage is applied to each of the pixel electrode 114 and the reflective electrode 117, an electric field is formed between the pixel electrode 114 and the reflective electrode 117 so that the organic light emitting layer 116 can emit light. The organic light emitting layer 116 can be formed of a plurality of subpixels SP and a common layer provided on the bank 115.

The organic light emitting layer 116 according to an embodiment can be provided to emit white light. The organic light emitting layer 116 can include a plurality of stacks which emit lights of different colors. For example, with reference to FIGS. 5 and 6, the organic light emitting layer 116 can include a first stack 116*a*, a second stack 116*c*, and a charge generating layer (CGL) 116*b* provided between the first stack 116*a* and the second stack 116*c*. The organic light emitting layer can be provided to emit the white light, and thus, each of the plurality of subpixels SP can include a color filter CF suitable for a corresponding color.

The first stack 116*a* can be provided on the pixel electrode 114 and can be implemented a structure where a hole injection layer (HIL), a hole transport layer (HTL), an emission layer (EML(B)), and an electron transport layer (ETL) are sequentially stacked.

The charge generating layer 116*b* can supply an electric charge to the first stack 116*a* and the second stack 116*c*. The charge generating layer 116*b* can include an N-type charge generating layer for supplying an electron to the first stack 116*a* and a P-type charge generating layer for supplying a hole to the second stack 116*c*. The N-type charge generating layer can include a metal material as a dopant.

The second stack 116*c* can be provided on the first stack 116*a* and can be implemented in a structure where a hole transport layer (HTL), a yellow-green (YG) emission layer (EML(YG)), and an electron injection layer (EIL) are sequentially stacked.

In the display apparatus 100 according to an embodiment of the present disclosure, because the organic light emitting layer 116 is provided as a common layer, the first stack 116*a*, the charge generating layer 116*b*, and the second stack 116*c* can be arranged all over the plurality of subpixels SP.

In the display apparatus 100 according to one embodiment of the present disclosure, a first stack 116*a* and/or a charge generation layer 116*b* of the organic light emitting layer 116 can be disconnected by the first void 141. Since the first void 141 is an empty space, when the organic light emitting layer 116 is entirely formed on the pixel electrode 114 and the bank 115, the layer below the organic light emitting layer 116, for example, the first stack 116*a* and/or a second stack 116*c* can be disconnected by the first void 141. For example, the first void 141 can create a kinked portion or a pinched portion in the organic light emitting layer 116 that can disconnect one or more layers within the organic light emitting layer 116. Therefore, since the display apparatus 100 according to one embodiment of the present disclosure can minimize or block the horizontal current flow from the subpixel SP for emitting light to the adjacent subpixel SP to flow the current in the vertical direction, a color gamut of a low gray scale can be enlarged and image quality can be improved.

Referring back to FIG. 3, the reflective electrode 117 can be formed on the light emitting layer 116. The reflective electrode 117 can be disposed in the light emission area EA and the non-light emission area NEA. The reflective electrode 117 according to one example can include a metal material. The reflective electrode 117 can reflect the light emitted from the organic light emitting layer 116 in the plurality of subpixels SP toward the lower surface of the substrate 110. Therefore, the display apparatus 100 according to one embodiment of the present disclosure can be implemented as a bottom emission type display apparatus.

The display apparatus 100 according to one embodiment of the present disclosure is a bottom emission type and has to reflect light emitted from the organic light emitting layer 116 toward the substrate 110, and thus the reflective electrode 117 can be made of a metal material having high reflectance. The reflective electrode 117 according to one example can be formed of a metal material having high reflectance such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy can be an alloy such as silver (Ag), palladium (Pd) and copper (Cu). The reflective electrode 117 can be expressed as terms such as a second electrode, a cathode electrode and a counter electrode.

The encapsulation layer 118 is formed on the reflective electrode 117. The encapsulation layer 118 serves to prevent oxygen or moisture from being permeated into the organic light emitting layer 116 and the reflective electrode 117. To this end, the encapsulation layer 118 can include at least one inorganic film and at least one organic film.

Meanwhile, as shown in FIG. 3, the encapsulation layer 118 can be disposed not only in the light emission area EA but also in the non-light emission area NEA. The encapsulation layer 118 can be disposed between the reflective electrode 117 and an opposing substrate 200.

In the display apparatus 100 according to one embodiment of the present disclosure, the pattern portion 120 can be provided near the light emission area EA (or the non-light emission area NEA) and the reflective pattern 130 can be provided on the pattern portion 120 in order to prevent light extraction efficiency from being reduced as some of the light emitted from the light emitting element layer is not discharged to the outside due to total reflection on an interface between the light emitting element layer and the electrode and/or an interface between the substrate and the air layer. The reflective pattern 130 can be disposed to be inclined along the profile of the pattern portion 120.

Also, in the display apparatus 100 according to one embodiment of the present disclosure, the light extraction portion 150, which includes a plurality of concave portions 151, is provided below the pixel electrode 114 to overlap with the light emission area EA, whereby light extraction efficiency can be maximized.

Hereinafter, the pattern portion 120 and the reflective pattern 130 of the display apparatus 100 according to one embodiment of the present disclosure will be described in more detail with reference to FIGS. 1 to 4.

In the display apparatus 100 according to one embodiment of the present disclosure, in order to prevent light extraction efficiency from being reduced as a portion of the light emitted from the light emitting element layer is not emitted to the outside due to total reflection on an interface between the light emitting element layer and an electrode and/or between the substrate and an air layer, the pattern portion 120 can be provided near the light emission area EA (or near the non-light emission area NEA) and the reflective pattern 130 can be provided on the pattern portion 120.

For example, as shown in FIG. 3, the pattern portion 120 can be formed to be concave in the first layer 1131 of the overcoat layer 113. As shown in FIGS. 2 and 3, the pattern portion 120 can be disposed near the non-light emission area NEA. That is, the pattern portion 120 can be disposed to surround the light emission area EA while being adjacent to the light extraction portion 150. The pattern portion 120 can be formed together with the non-light emission area NEA when the plurality of concave portions 151 are formed in the light emission area EA. For example, the pattern portion 120 and the plurality of concave portions 151 can be depressions that are formed in the first layer 1131 of the overcoat layer 113, during a same process. The pattern portion 120 according to one example can be disposed in the form of a slit, a groove, a depression or a trench to surround the light emission area EA. The pattern portion 120 can include a bottom surface **120*b* and an inclined surface 120*s***.

The bottom surface **120*b* of the pattern portion 120 according to one embodiment is a surface formed to be closest to the substrate 110, or can be disposed to be closer to the substrate 110 (or the upper surface of the substrate) than the pixel electrode 114 (or the lower surface of the pixel electrode 114) in the light emission area EA. Therefore, as shown in FIG. 3, the bottom surface 120*b* of the pattern portion 120 can be provided with the same or a similar depth as each of the plurality of concave portions 151. However, if the depth of the pattern portion 120 is lower than the depth of the concave portion 151, the area of the reflection pattern 130 capable of reflecting light is reduced, and thus light extraction efficiency can be reduced. Therefore, in the display apparatus 100 according to one embodiment of the present disclosure, the depth of the pattern portion 120 can be provided to be equal to or deeper than that of the concave portion 151. For example, a depth of the pattern portion 120 relative to the upper surface 1131*a* of the first layer 1131 can be equal to a depth of each of the plurality of concave portions 151 relative to the upper surface 1131*a* of the first layer 1131**.

The inclined surface **120*s* of the pattern portion 120 can be disposed between the bottom surface 120*b* and the light extraction portion 150. Therefore, the inclined surface 120*s* of the pattern portion 120 can be provided to surround the light emission area EA or the plurality of concave portions 151. As shown in FIG. 3, the inclined surface 120*s* can be connected to the bottom surface 120*b*. The inclined surface 120*s* can form a predetermined angle θ with the bottom surface 120*b*. For example, the angle θ formed by the inclined surface 120*s* and the bottom surface 120*b* can be an obtuse angle. Therefore, the width of the pattern portion 120 can be gradually reduced in a direction (or the third direction (Z-axis direction)) from the opposite substrate 200 (or the reflective pattern 130) toward the substrate 110. For example, the pattern portion 120 can have a reverse tapered shape relative to the substrate 110. As the inclined surface 120*s* and the bottom surface 120*b* form the obtuse angle, each of the second layer 1132, the reflective pattern 130, the bank 115 and the reflective electrode 117, which are formed in a subsequent process, can be formed to be inclined (or concave) along the profile of the pattern portion 120. The light emitting element layer E can be formed to be concave on the pattern portion 120 along the profile of the pattern portion 120 formed to be concave in the non-light emission area NEA (or the peripheral area). The light emitting element layer E formed to be concave on the pattern portion 120 can mean that it includes at least one of the pixel electrode 114, the organic light emitting layer 116 or the reflective electrode 117**.

As shown in FIG. 2, the pattern portion 120 can be provided to surround the light emission area EA. As the pattern portion 120 is provided to surround the light emission area EA, and at least a portion of the reflective pattern 130 disposed on the pattern portion 120 can be provided to surround the light emission area EA. Therefore, in the display apparatus 100 according to one embodiment of the present disclosure, since light can be extracted through the reflective pattern 130 even from the non-light emission area NEA near the light emission area EA, overall light efficiency can be improved and power consumption can be reduced. Therefore, the display apparatus 100 according to one embodiment of the present disclosure can have the same light emission efficiency or more improved light emission efficiency even with low power as compared with a general display apparatus having no pattern portion 120 and reflective pattern 130 on the pattern portion 120, whereby overall power consumption can be reduced.

In addition, the display apparatus 100 according to one embodiment of the present disclosure can allow the light emitting element layer E to emit light even with low power, thereby improving lifespan of the light emitting element layer E.

Referring to FIG. 2, the pattern portion 120 can include a first pattern line 121 disposed in the first direction (X-axis direction) between the circuit area CA and the light emission area EA and a second pattern line 122 disposed in the second direction (Y-axis direction) crossing the first direction (X-axis direction). Referring to FIG. 2, the first pattern line 121 can mean the pattern portion 120 disposed in a horizontal direction, and the second pattern line 122 can mean the pattern portion 120 disposed in a vertical direction.

The first pattern line 121 can include a bottom surface and an inclined surface. The second pattern line 122 can include a bottom surface **122*b* and an inclined surface 122*s*. Since each of the bottom surface and the inclined surface of the first pattern line 121 and each of the bottom surface 122*b* and the inclined surface 122*s* of the second pattern line 122 are the same as each of the bottom surface 120*b* and the inclined surface 120*s* of the pattern portion 120, their description thereof is replaced with the description of the bottom surface 120*b* and the inclined surface 120*s* of the pattern portion 120. The first pattern line 121 and the second pattern line 122** can be connected to one in the non-light emission area NEA (or the peripheral area) to surround the light emission area EA.

The first pattern line 121 can be disposed between the subpixels SP for emitting light of the same color. For example, the first pattern line 121 can be disposed between the first subpixels SP1 disposed in the second direction (Y-axis direction). Therefore, the first pattern line 121 can be disposed in the first direction (X-axis direction). In contrast, the second pattern line 122 can be disposed between the subpixels SP for emitting light of different colors. For example, the second pattern line 122 can be disposed between the first subpixel SP1 that is a red subpixel, and the second subpixel SP2 that is a green pixel. Therefore, the second pattern line 122 can be disposed in the second direction (Y-axis direction).

Since the second pattern line 122 is disposed between the subpixels SP for emitting light of different colors, the reflective pattern 130 on the second pattern line 122 can prevent light of different colors from being emitted to other adjacent subpixels SP. Therefore, the display apparatus 100 according to the present disclosure can prevent color mixture (or color distortion) between the subpixels SP for emitting light of different colors, thereby improving color purity.

With reference to FIG. 3, the second layer 1132 of the overcoat layer 113 can be further extended from the light emission area EA to the non-light emission area NEA to partially cover the inclined surface **120*s* of the pattern portion 120 between the reflective pattern 130 and the inclined surface 120*s*. Therefore, as shown in FIG. 3, an end 1132*c* of the second layer 1132 can be in contact with the bottom surface 120*b* of the pattern portion 120. In this situation, the end 1132*c* of the second layer 1132 can be in contact with only a portion of the bottom surface 120*b* of the pattern portion 120. When the second layer 1132 entirely covers the bottom surface 120*b*, the depth of the reflective pattern 130 formed on the pattern portion 120 can be relatively reduced or made shallower, thereby reducing reflective efficiency. Therefore, in the display apparatus 100 according to one embodiment of the present disclosure, the second layer 1132 is provided to be in contact with only a portion of the bottom surface 120*b* without entirely covering the bottom surface 120*b* of the pattern portion 120 and thus the reflective pattern 130 formed in a subsequent process can be formed to be close to the bottom surface 120*b***, whereby reflective efficiency can be improved.

The reflective pattern 130 covers the inclined surface of the second layer 1132 covering the inclined surface **120*s* of the pattern portion 120, and can be in contact with a portion of the bottom surface 120*b* of the pattern portion 120. This is because that the material constituting the reflective pattern 130 is entirely deposited and then a wet etching process is performed using the patterned bank 115 as an anti-etching layer. Therefore, a portion of the reflective pattern 130 can be in direct contact with a portion of the bottom surface 120*b***.

The bank 115 can be extended from the edge of the pixel electrode 114 to cover the reflective pattern 130 covering the inclined surface **1132*b* of the second layer 1132. Therefore, as shown in FIG. 4, the bank 115 can be upward spaced apart from the pixel electrode 114 with one side 130*a* of the reflective pattern 130 interposed therebetween. The bank 115 can be upward spaced apart from the bottom surface 120*b* of the pattern portion 120 with the other side 130*b* of the reflective pattern 130** interposed therebetween.

Each of the second layer 1132, the reflective pattern 130 and the bank 115 on the bottom surface **120*b* of the pattern portion 120 can be discontinuously provided. That is, each of the second layer 1132, the reflective pattern 130 and the bank 115 can be disconnected on the bottom surface 120*b* of the pattern portion 120. The disconnection of the second layer 1132 is to increase a reflection area of the reflective pattern 130 formed in a subsequent process. Since the reflective pattern 130 covers the edge of the pixel electrode 114, when the reflective pattern 130 is not disconnected on the bottom surface 120*b*, light can be emitted even from the non-light emission area NEA between the banks 115 to cause a color mixture. Therefore, the disconnection of the reflective pattern 130 is intended so as not to cause such a color mixture. The disconnection of the bank 115 is to enlarge a color gamut of a low gray scale by forming a void (or a second void 142**) even in a boundary portion of the plurality of subpixels SP (or between the plurality of subpixels SP) to maximize the blocking of the current flow from the subpixel SP for emitting light to the adjacent subpixel SP (or horizontally).

Consequently, in the display apparatus 100 according to one embodiment of the present disclosure, each of the second layer 1132, the reflective pattern 130 and the bank 115, which are on the bottom surface **120*b* of the pattern portion 120**, is continuously provided so that light extraction efficiency can be improved in accordance with the increase in the reflection area, and at the same time a color mixture can be prevented from occurring and enlargement of a color gamut of a low gray scale can be maximized and image quality can be improved.

Referring to FIGS. 3 and 4, in the display apparatus 100 according to one embodiment of the present disclosure, the non-light emission area NEA can further include a second void 142. The second void 142 can further minimize or block the horizontal current flow by allowing a portion of the plurality of layers constituting the organic light emitting layer 116, for example, the first stack 116*a* and/or the charge generation layer 116*b* to be disconnected. Since the first void 141 and the second void 142 have the same function of minimizing or blocking the horizontal current flow through the organic light emitting layer 116, the first void 141 and the second void 142 can be included in the void 140. Since the void 140 is configured to minimize or block the horizontal current flow, the void 140 can be expressed as terms such as a horizontal current flow prevention portion, a horizontal current flow blocking portion, a side leakage current prevention portion and a side leakage current blocking portion.

The second void 142 according to one embodiment can be disposed to be spaced apart from the first void 141 (e.g., the second void 142 and the first void 141 can be located on opposite sides of the reflective pattern 130). For example, as shown in FIG. 4, the second void 142 can be formed between the bank 115 and the bottom surface 120*b* of the pattern portion 120 while being adjacent to the other side 130*b* of the reflective pattern 130. Therefore, the first void 141 and the second void 142 can be disposed on one side and the other side of the reflective pattern 130, respectively. That is, the first void 141 and the second void 142 can be disposed on both sides of the reflective pattern 130.

As shown in FIG. 3, the organic light emitting layer 116 can be extended from the light emission area EA to the bottom surface 120*b* of the pattern portion 120, and in this situation, the first stack 116*a* and/or the charge generation layer 116*b* of the organic light emitting layer 116 can be disconnected by the second void 142.

Hereinafter, the decrease in the thickness of the organic light emitting layer 116 provided as a common layer due to the first void 141 and the second void 142, that is, disconnection of a portion of the plurality of layers constituting the organic light emitting layer 116 by each of the first void 141 and the second void 142 will be described in detail with reference to FIGS. 5 and 6.

Figure 6:
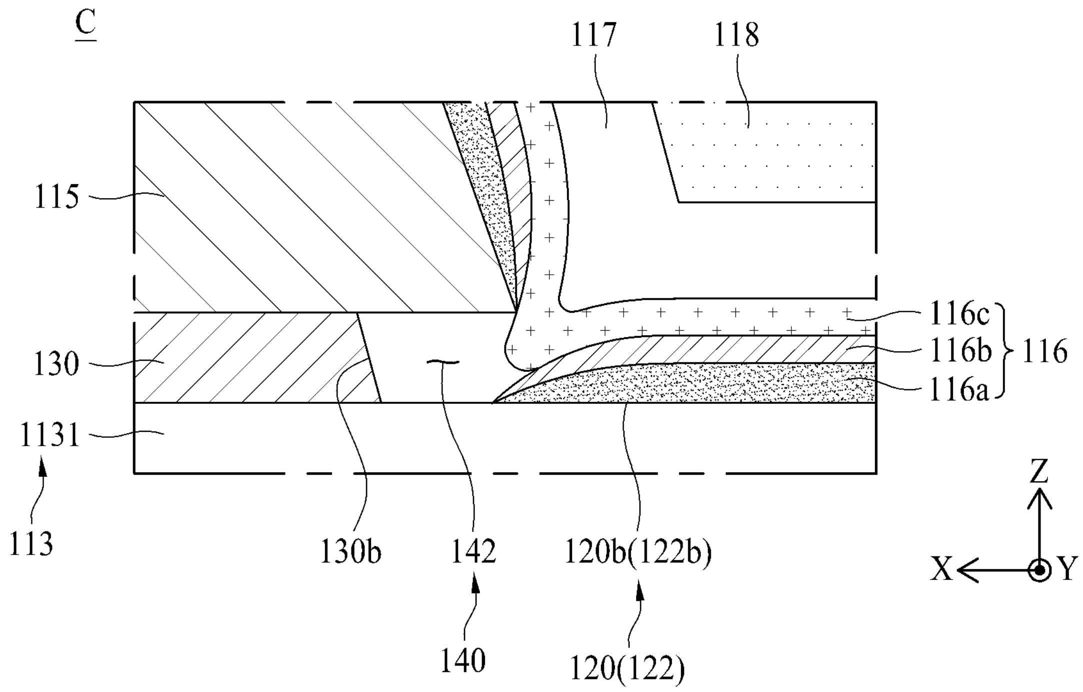
FIG. 6 is a schematic enlarged view illustrating a portion C shown in FIG. 4 according to an embodiment of the present disclosure.

FIG. 5 is a schematic enlarged view illustrating a portion B shown in FIG. 4, and FIG. 6 is a schematic enlarged view illustrating a portion C shown in FIG. 4.

First, referring to FIG. 5, the first stack 116*a* and the charge generation layer 116*b* of the organic light emitting layer 116 can be disconnected by the first void 141. As described above, the first void 141 can be formed to be adjacent to one side 130*a* of the reflective pattern 130 between the bank 115 and the pixel electrode 114 by a wet etching process after the bank 115 is formed. In addition, the first stack 116*a*, the charge generation layer 116*b* and the second stack 116*c*, which constitute the organic light emitting layer 116, can be sequentially formed in a subsequent process. In this situation, the first stack 116*a* and the charge generation layer 116*b* can be disconnected by the first void 141 formed as an empty space below the bank 115. In detail, when the first stack 116*a* and the charge generation layer 116*b* are formed, the bank 115 more protruded toward the light emission area than the reflective pattern 130 acts as an eaves, so that the first stack 116*a* and the charge generation layer 116*b* may not be formed to have a sufficient thickness and their thicknesses can be reduced toward the inside of the first void 141 (or one side 130*a* of the reflective pattern 130). For example, portions of the organic light emitting layer 116 can flow into the first void 141 (e.g., into an undercut area under an overhang portion of the bank 115), which can thin and disconnect layers within the organic light emitting layer 116. Therefore, the first stack 116*a* and the charge generation layer 116*b* can be disconnected by the first void 141 formed between the pixel electrode 114 and the bank 115.

However, since the second stack 116*c* is formed on the first stack 116*a* and the charge generation layer 116*b*, which are disconnected on the pixel electrode 114, the second stack 116*c* can be formed to be at higher position than the first stack 116*a* and the charge generation layer 116*b* as much as a summed thickness of the first stack 116*a* and the charge generation layer 116*b*. Therefore, as shown in FIG. 5, the second stack 116*c* can be continuously formed without being disconnected by the first void 141. As the second stack 116*c* is continuously formed without being disconnected by the first void 141, the reflective electrode 117 formed on the second stack 116*c* can be continuously formed without being disconnected. Therefore, the display apparatus 100 according to one embodiment of the present disclosure includes the first void 141 to minimize or block the horizontal current flow, thereby enlarging a color gamut of a low gray scale. Also, in the display apparatus 100 according to one embodiment of the present disclosure, as at least a portion (or the second stack 116*c*) of the organic light emitting layer 116 adjacent to the first void 141 is continuously provided, disconnection of the reflective electrode 117 can be avoided to block external oxygen and moisture permeation through the reflective electrode 117. For example, the reflective electrode 117 can still continuously extend across adjacent subpixels without being disconnected by the first void 141, which can seal and protect the subpixels.

Next, referring to FIG. 6, the first stack 116*a* and the charge generation layer 116*b* of the organic light emitting layer 116 can be disconnected by the second void 142. As described above, the second void 142 can be formed to be adjacent to the other side 130*b* of the reflective pattern 130 between the bank 115 and the bottom surface 120*b* of the pattern portion 120 by a wet etching process after the bank 115 is formed. In addition, the first stack 116*a*, the charge generation layer 116*b* and the second stack 116*c*, which constitute the organic light emitting layer 116, can be sequentially formed in a subsequent process. In this situation, the first stack 116*a* and the charge generation layer 116*b* can be disconnected by the second void 142 formed as an empty space below the bank 115. In detail, when the first stack 116*a* and the charge generation layer 116*b* are formed, the bank 115 more protruded toward the adjacent subpixel SP than the reflective pattern 130 acts as an eaves, so that the first stack 116*a* and the charge generation layer 116*b* are not formed to have a sufficient thickness and their thicknesses can be reduced toward the inside of the second void 142 (or the other side 130*b* of the reflective pattern 130). For example, portions of the organic light emitting layer 116 can flow into the second void 142 (e.g., into an undercut area under an overhang portion of the bank 115), which can thin and disconnect layers within the organic light emitting layer 116. Therefore, the first stack 116*a* and the charge generation layer 116*b* can be disconnected by the second void 142 formed between the bottom surface 120*b* of the pattern portion 120 and the bank 115.

However, since the second stack 116*c* is formed on the first stack 116*a* and the charge generation layer 116*b*, which are disconnected on the bottom surface 120*b*, the second stack 116*c* can be formed to be at a higher position than the first stack 116*a* and the charge generation layer 116*b* as much as a summed thickness of the first stack 116*a* and the charge generation layer 116*b*. Therefore, as shown in FIG. 6, the second stack 116*c* can be continuously formed without being disconnected by the second void 142. As the second stack 116*c* is continuously formed without being disconnected by the second void 142, the reflective electrode 117 formed on the second stack 116*c* can be continuously formed without being disconnected. Therefore, the display apparatus 100 according to one embodiment of the present disclosure includes the second void 142 to doubly minimize or block the horizontal current flow together with the first void 141, thereby maximizing enlargement of the color gamut of a low gray scale. Also, in the display apparatus 100 according to one embodiment of the present disclosure, as at least a portion (or the second stack 116*c*) of the organic light emitting layer 116 adjacent to the second void 142 can be continuously provided, disconnection of the reflective electrode 117 can be avoided to block external oxygen and moisture permeation through the reflective electrode 117. For example, the reflective electrode 117 can still continuously extend across adjacent subpixels without being disconnected by the second void 142, which can seal and protect the subpixels.

Consequently, in the display apparatus 100 according to one embodiment of the present disclosure, the reflective electrode 117 is continuously provided without being disconnected on the first void 141 and the second void 142, so that the reflective electrode 117 can be implemented as a common electrode (or conductive electrode) on the light emission area EA and the non-light emission area NEA. In this situation, "on the first void 141 and the second voice 142" can mean a predetermined area adjacent to each of the first void 141 and the second void 142. For example, the predetermined area can include a side area and/or a diagonal area, which is adjacent to each of the first void 141 and the second void 142. Therefore, the display apparatus 100 according to one embodiment of the present disclosure can improve lifespan of the light emitting element layer by utilizing the reflective electrode 117 as a protective film (or anti-moisture film) for blocking external oxygen and moisture permeation.

The first stack 116*a* and the charge generation layer 116*b* of the organic light emitting layer 116 have been described as being disconnected, but the embodiment is not limited thereto, and only the first stack 116*a* can be disconnected. However, when the charge generation layer 116*b* having high conductivity is disconnected, the horizontal current flow can be more effectively minimized or blocked. Therefore, the first void 141 and/or the second void 142 can be formed to have a size (or thickness) that can be disconnected up to the charge generation layer 116*b*.

In this situation, the size (or thickness) of the first void 141 can mean a vertical distance between the pixel electrode 114 and the bank 115. The size (or thickness) of the second void 142 can mean a vertical distance between the bottom surface 120*b* of the pattern portion 120 and the bank 115. The vertical distance can be a direction parallel with the third direction (Z-axis direction). Therefore, the size (or thickness) of the first void 141 and the size (or thickness) of the second void 142 can be determined by the thickness of the reflective pattern 130.

For example, when the thickness of the reflective pattern 130 is thinner than a thickness of the reflective pattern 130 shown in FIG. 5, since the size (or thickness) of the first void 141 is reduced, only the first stack 116*a* can be disconnected. On the contrary, when the thickness of the reflective pattern 130 is thicker than the thickness of the reflective pattern 130 shown in FIG. 5, since the size (or thickness) of the first void 141 is increased, all of the first stack 116*a*, the charge generation layer 116*b* and the second stack 116*c* can be disconnected. Therefore, the display apparatus 100 according to one embodiment of the present disclosure can adjust the degree of disconnection of the organic light emitting layer 116 by adjusting the thickness of the reflective pattern 130 (e.g., by adjusting the size of the undercut area under the bank 115). As described above, in the display apparatus 100 according to one embodiment of the present disclosure, the thickness of the reflective pattern 130 can be provided so that the charge generation layer 116*b* of the organic light emitting layer 116 can be disconnected or cut off, whereby the horizontal current flow can be minimized and moisture permeation through the reflective electrode 117 can be blocked.

Meanwhile, in the display apparatus 100 according to one embodiment of the present disclosure, the light emitted from the light emission area EA can be reflected by the reflective pattern 130 without passing through the bank 115. Therefore, in the display apparatus 100 according to another embodiment of the present disclosure, the bank 115 can be provided as a black bank, so that reflection of external light toward the reflective electrode 117 and/or the circuit portion can be minimized. Therefore, the display apparatus 100 according to another embodiment of the present disclosure can improve black visibility during non-driving of the display area DA.

According to the present disclosure, the following advantageous effects can be obtained.

In the display apparatus according to the present disclosure, the reflective pattern is provided on the pattern portion formed to be concave in the periphery of the non-light emission area, so that the light can be extracted even from the non-light emission area, whereby overall light efficiency can be improved and power consumption can be reduced.

In the display apparatus according to the present disclosure, each of the plurality of subpixels includes the light extraction portion that includes the plurality of concave portions, so that light extraction efficiency of the light emitted from the light emitting element layer can be further improved.

In the display apparatus according to the present disclosure, the pixel electrode included in each of the plurality of subpixels can be provided to be flat, so that occurrence of a radial rainbow pattern and a radial circular ring pattern can be suppressed or minimized, whereby black visibility can be improved in a non-driving or off state.

In the display apparatus according to the present disclosure, since the light can be extracted even from the non-light emission area, the display apparatus according to the present disclosure can have the same light emission efficiency or more improved light emission efficiency even with low power, whereby overall power consumption can be reduced.

In the display apparatus according to the present disclosure, the first void for reducing the thickness of the organic light emitting layer or removing the organic light emitting layer is formed between the lower portion of the bank and the pixel electrode, so that the horizontal current flow can be minimized or blocked, whereby a color gamut of a low gray scale can be enlarged.

In the display apparatus according to the present disclosure, the second void for reducing the thickness of the organic light emitting layer or removing the organic light emitting layer is formed between the lower portion of the bank and the overcoat layer, so that blocking of the horizontal current flow can be maximized, whereby color uniformity can be increased.

In the display apparatus according to the present disclosure, the reflective electrode on the first void or the second void is continuously provided, so that external oxygen or moisture permeation through the reflective electrode can be blocked.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display apparatus comprising:

a plurality of subpixels disposed on a substrate;

a pattern portion disposed on the substrate, the pattern portion forming a concave area between at least two subpixels among the plurality of subpixels; and a reflective pattern partially overlapping with a portion of the pattern portion, wherein the plurality of subpixels include a light emission area and a non-light emission area adjacent to the light emission area, the reflective pattern being disposed in the non-light emission area, wherein the non-light emission area includes a first void located between the light emission area and the reflective pattern, wherein the plurality of subpixels include a bank disposed on the reflective pattern and over the first void, and wherein a width of the bank is greater than a width of the reflective pattern.

2. The display apparatus of claim 1, wherein the plurality of subpixels include an organic light emitting layer on the light emission area and the non-light emission area, and wherein a thickness of the organic light emitting layer adjacent to the first void in the non-light emission area is thinner than a thickness of the organic light emitting layer in the light emission area.

3. The display apparatus of claim 1, wherein the first void surrounds the light emission area.

4. The display apparatus of claim 1, wherein the first void extends along an edge of the bank.

5. The display apparatus of claim 1, wherein the bank is a black bank or includes a black material.

6. The display apparatus of claim 1, wherein a width of the pattern portion is reduced from the reflective pattern toward the substrate or the pattern portion has a reverse tapered shape relative to the substrate.

7. The display apparatus of claim 1, wherein the pattern portion surrounds the light emission area in a form of a groove, a depression, a slit or a trench.

8. The display apparatus of claim 1, wherein the plurality of subpixels further include an organic light emitting layer disposed on the light emission area and the non-light emission area, and wherein a first thickness of the organic light emitting layer in an area adjacent to the first void is thinner than a second thickness of the organic light emitting layer on the reflective pattern.

9. A display apparatus comprising:

a plurality of subpixels disposed on a substrate;

a pattern portion disposed on the substrate, the pattern portion forming a concave area between at least two subpixels among the plurality of subpixels; and a reflective pattern partially overlapping with a portion of the pattern portion, wherein the plurality of subpixels include a light emission area and a non-light emission area adjacent to the light emission area, the reflective pattern being disposed in the non-light emission area, wherein the non-light emission area includes a first void located between the light emission area and the reflective pattern, wherein the plurality of subpixels include:

an organic light emitting layer disposed on the light emission area and the non-light emission area;

a bank disposed on the reflective pattern and over the first void; and a pixel electrode partially overlapping with the reflective pattern, the pixel electrode being disposed between the substrate and the reflective pattern, wherein the organic light emitting layer is disposed on the pixel electrode and the bank, and wherein the first void is located between the organic light emitting layer and the reflective pattern in an area under the bank.

10. The display apparatus of claim 9, wherein the organic light emitting layer includes a first stack, a second stack disposed on the first stack and a charge generation layer disposed between the first stack and the second stack, and wherein at least one of the first stack and the charge generation layer is disconnected by the first void.

11. The display apparatus of claim 10, wherein the pattern portion includes a bottom surface and an inclined surface connected to the bottom surface, and wherein the non-light emission area further includes a second void disposed adjacent to the reflective pattern, the second void being located between the bank and the bottom surface of the pattern portion.

12. The display apparatus of claim 11, wherein the organic light emitting layer extends from the light emission area to the bottom surface of the pattern portion, and wherein at least one of the first stack and the charge generation layer of the organic light emitting layer is disconnected by the second void.

13. The display apparatus of claim 11, wherein the plurality of subpixels further include a reflective electrode disposed on the organic light emitting layer, and wherein the reflective electrode continuously extends across both of the first void and the second void.

14. The display apparatus of claim 9, further comprising:

an overcoat layer disposed between the substrate and the pixel electrode; and a light extraction portion having a plurality of concave portions disposed inside the overcoat layer, wherein the light extraction portion partially overlaps with the light emission area and is disposed adjacent to the pattern portion.

15. The display apparatus of claim 14, wherein the overcoat layer includes:

a first layer including the plurality of concave portions; and a second layer disposed between the first layer and the pixel electrode.

16. The display apparatus of claim 15, wherein a refractive index of the second layer is greater than a refractive index of the first layer.

17. The display apparatus of claim 15, wherein the second layer partially overlaps with the light emission area, and wherein an upper surface of the second layer is substantially flat.

18. The display apparatus of claim 15, wherein the pattern portion includes a bottom surface and an inclined surface located between the bottom surface and the light extraction portion, wherein the second layer partially covers the inclined surface and is disposed between the reflective pattern and the inclined surface of the pattern portion, and wherein an end of the second layer is in contact with the bottom surface of the pattern portion.

19. The display apparatus of claim 18, wherein the reflective pattern covers an inclined surface of the second layer covering the inclined surface of the pattern portion, and the reflective pattern is in contact with a portion of the bottom surface of the pattern portion.

20. The display apparatus of claim 19, wherein the bank covers the reflective pattern covering the inclined surface of the second layer, and the bank is spaced apart from the bottom surface of the pattern portion.

21. The display apparatus of claim 20, wherein each of the second layer, the reflective pattern and the bank on the bottom surface of the pattern portion is discontinuous.

22. The display apparatus of claim 9, wherein the first void is located adjacent to one side of the reflective pattern in an area between the bank and the pixel electrode.

23. A display apparatus comprising:

at least two subpixels disposed on a substrate;

an overcoat layer disposed between the substrate and the at least two subpixels, the overcoat layer including a depression located between the at least two subpixels;

a reflective pattern disposed in the depression in the overcoat layer;

a bank disposed between the at least two subpixels;

a light emitting layer disposed in the at least two subpixels; and a first void disposed between the light emitting layer and the reflective pattern, wherein the bank includes at least one overhang portion disposed adjacent to an edge of the reflective pattern, wherein a portion of the light emitting layer is disposed under the at least one overhang portion of the bank, wherein the bank is disposed over the reflective pattern and the first void, and wherein a width of the bank is greater than a width of the reflective pattern.

24. The display apparatus of claim 23, further comprising:

at least one undercut area located between the at least one overhang portion of the bank and the substrate, wherein the at least two subpixels include a light emission area, and wherein a first thickness the light emitting layer adjacent to the undercut area is thinner than a second thickness of the light emitting layer in the light emission area.

25. The display apparatus of claim 23, wherein the reflective pattern is disposed on an inclined side surface of the overcoat layer.

26. The display apparatus of claim 23, wherein the reflective pattern is disposed on a bottom surface of the depression in the overcoat layer.

27. The display apparatus of claim 23, wherein the at least one overhang portion of the bank includes a first overhang portion and a second overhang portion located on opposite sides of the reflective pattern, and wherein a first undercut area is located under the first overhang portion and a second undercut area is located under the second overhang portion.

28. The display apparatus of claim 27, wherein the first void is located in the first undercut area and a second void is located in the second undercut area, and wherein the first void and the second void are free of any material.

29. The display apparatus of claim 23, wherein the overcoat layer includes a first layer and a second layer, wherein the first layer includes a plurality of concave depressions in a light emission area of the at least two subpixels, and wherein the second layer fills the plurality of concave depressions in the first layer.

30. The display apparatus of claim 29, wherein a depth of the depression in the overcoat layer is substantially equal to a depth of each of the plurality of concave depressions in the first layer of the overcoat layer.

31. The display apparatus of claim 23, wherein the light emitting layer includes a plurality of layers, and wherein at least one of the plurality of layers of the light emitting layer is disconnected in an area corresponding to the at least one overhang portion of the bank.

32. The display apparatus of claim 23, wherein a portion of the bank is disposed between the light emitting layer and the reflective pattern.

33. The display apparatus of claim 23, wherein the overcoat layer is transparent.

* * * * *